United States Patent
Hirano et al.

(10) Patent No.: US 6,472,749 B1
(45) Date of Patent: Oct. 29, 2002

(54) SEMICONDUCTOR DEVICE HAVING A SHORTENED WIRING LENGTH TO REDUCE THE SIZE OF A CHIP

(75) Inventors: Tsugihiko Hirano, Hakodate (JP); Hidemi Ozawa, Yamato (JP)

(73) Assignees: Hitachi, Ltd., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 09/495,918

(22) Filed: Feb. 2, 2000

(30) Foreign Application Priority Data

Feb. 15, 1999 (JP) .............................. 11-036142

(51) Int. Cl.⁷ .............................................. H01L 23/48
(52) U.S. Cl. ................... 257/737; 257/738; 257/773; 257/774; 257/779; 257/780; 257/784; 257/786; 174/52.4
(58) Field of Search .................. 257/737, 738, 257/779, 780, 782, 784, 786, 678, 773, 774, 777, 778, 783; 438/124, 127, 612, 613, 617, 666; 174/52.3, 52.4, 52.2

(56) References Cited

U.S. PATENT DOCUMENTS

| | | | | |
|---|---|---|---|---|
| 5,903,051 A | * | 5/1999 | Miks et al. ................. | 257/700 |
| 6,054,755 A | * | 4/2000 | Takamichi et al. .......... | 257/667 |
| 6,060,775 A | * | 5/2000 | Ano ............................ | 257/693 |
| 6,064,111 A | * | 5/2000 | Sota et al. ................... | 257/667 |
| 6,160,313 A | * | 12/2000 | Takashima et al. ......... | 257/737 |
| 6,198,165 B1 | * | 3/2001 | Yamaji et al. .............. | 257/734 |
| 6,201,707 B1 | * | 3/2001 | Sota .......................... | 174/52.4 |
| 6,232,650 B1 | * | 5/2001 | Fujisawa et al. ............ | 257/666 |
| 6,232,661 B1 | * | 5/2001 | Amagai et al. ............. | 257/737 |
| 6,242,815 B1 | * | 6/2001 | Hsu et al. ................... | 257/786 |

FOREIGN PATENT DOCUMENTS

| JP | 9-121002 | * 5/1997 |
|---|---|---|
| JP | 11-204549 | * 7/1999 |

OTHER PUBLICATIONS

"Electronic Parts and Materials", Sep. 1998, published by Kogyo Chosakai, pp. 22–27, 33–41, with English translations.

* cited by examiner

Primary Examiner—David L. Talbott
Assistant Examiner—Alonzo Chambliss
(74) Attorney, Agent, or Firm—Mattingly, Stanger & Malur, P.C.

(57) ABSTRACT

Provided is a technique which permits production of a semiconductor device having, integrated therein, a semiconductor chip smaller in external size than an ordinary semiconductor chip without lowering the production yield. The semiconductor device according to the present invention comprises a substrate having a square-shaped plane and having an interconnection formed on a first surface (chip mounting surface) of first and second opposite surfaces; a semiconductor chip which is mounted on the first surface of said substrate and has an electrode formed on a first surface (circuit forming surface) of first and second opposite surfaces of the semiconductor chip, and a conductive wire for electrically connecting the electrode of said semiconductor chip with the interconnection of said substrate, said interconnection having a plurality of connecting pads arranged from the peripheral side toward the inner side of said substrate.

3 Claims, 24 Drawing Sheets

SEMICONDUCTOR DEVICE HAVING A SHORTENED WIRING LENGTH TO REDUCE THE SIZE OF A CHIP

BACKGROUND OF THE INVENTION

The present invention relates to a semiconductor device. In particular, the present invention relates to a technique effective when used for a semiconductor device having a face up structure.

Semiconductor devices which are integrated in small-sized electronic equipment such as mobile phone, portable information processing terminal equipment or portable personal computer are requested to be thinner and smaller and have more pins. As semiconductor devices satisfying such requirements, CSP (Chip Size Package or Chip Scale Package) type ones have been developed for example. CSP type semiconductor devices having various structures have been proposed and already industrialized, but among them, those having a face up structure which can be produced at a low cost using an existing plant are most popular.

The CSP type semiconductors having a face up structure each principally comprises a substrate (interconnection (wiring)substrate) having an interconnection(wiring) formed on a chip mounting surface which is the first surface (one main surface) of first and second surfaces (one main surface and the other main surface which are opposite to each other), a semiconductor chip being mounted on the chip mounting surface of the substrate and having an electrode (bonding pad) formed on a circuit forming surface which is the first surface (one main surface) of first and second surfaces (one main surface and the other main surface which are opposite to each other), a conductive wire (bonding wire) for electrically connecting the electrode of the semiconductor chip and the interconnection of the substrate, a resin sealing body (resin body) for sealing therewith the semiconductor chip, wire and the like, and a bump electrode (external terminal) disposed on the second surface of the substrate as an externally connecting terminal. The interconnection has a wire connecting pad (wire connection portion) disposed at the periphery of the substrate and a bump connecting land (bump connecting portion) disposed on the more internal side on the substrate than the wire connecting pad. The wire is connected, at one end thereof, with the electrode of the semiconductor chip and, at the other end thereof, with the wire connecting pad of the interconnection. The bump electrode is connected with a bump connecting land of the interconnection through a connecting hole (through hole) from the second surface (the other main surface) side of the substrate.

The CSP-type semiconductor device having a face up structure is described in, for example, "Electronic Parts and Materials, September issue, pp. 22–52 (1998)" published by Kogyo Chosakai.

SUMMARY OF THE INVENTION

The present inventors have investigated the above-described CSP type semiconductor device having a face up structure and found the below-described problems.

In the face up structure, a wire connecting pad is indispensable for interconnection, because an electrode formed on a circuit forming surface of a semiconductor chip and an interconnection formed on the chip mounting surface of a substrate are electrically connected via a conductive wire. Only one wire connecting pad is formed per interconnection, which does not cause a problem when an ordinarily-employed semiconductor chip of a predetermined external size is mounted. When a semiconductor chip has an external size smaller than that of an ordinary semiconductor chip, on the other hand, the length of the wire for connecting the electrode of the semiconductor chip with the wire connection pad of the interconnection increases with a decrease in the external size of the semiconductor chip, which worsens the sagging of the wire (sagging of the wire loop after bonding), leading to a tendency to cause inconveniences such as short-circuit between the wire and the interconnection in a wire bonding step for connecting the electrode of the semiconductor chip with the wire connecting pad of the interconnection via the wire. This tendency due to the worsening of the wire sagging is eminent particularly in the CSP type semiconductor, because the loop height (the height from the circuit forming surface of the semiconductor chip to the top portion perpendicular thereto) of the wire is lowered for making the semiconductor device thinner.

In a step for sealing the semiconductor chip, wire and the like with a resin sealing body by the transfer molding method, the wire flow tends to be caused by the insulating resin injected under pressure, leading to inconveniences such as short-circuit between two adjacent wires.

Inconveniences as described above markedly lower a production yield of the semiconductor device having, integrated therein, a semiconductor chip having a smaller external size than an ordinary semiconductor chip having a predetermined external size.

In addition, with an increase in the length of the wire, an inductance increases, which deteriorates electrical properties of the semiconductor device having, integrated therein, a semiconductor chip having an external size smaller than an ordinary semiconductor chip.

Such problems also tend to occur in the chip shrink for reducing the whole size of the semiconductor chip.

An object of the present invention is to provide a technique permitting the production of a semiconductor device having, integrated therein, a semiconductor chip of a smaller external size than an ordinary semiconductor chip without lowering a production yield.

Another object of the present invention is to provide a technique permitting the production of a semiconductor device having, integrated therein, a semiconductor chip of a smaller external size than an ordinary semiconductor chip without deteriorating electrical properties.

The above-described and the other objects and novel features of the present invention will be apparent by the description herein and accompanying drawings.

Among the inventions disclosed by the present application, summaries of the representative ones will next be described briefly.

(1) A semiconductor device which is formed to have a square plane and has a substrate having an interconnection formed on the first surface (chip mounting surface) of first and second opposite surfaces, a semiconductor chip which is mounted on the first surface of the substrate and has an electrode formed on the first surface (circuit forming surface) of first and second opposite surfaces and a conductive wire for electrically connecting the electrode of the semiconductor chip and the interconnection of the substrate, wherein the interconnection has a plurality of wire connecting pads which are arranged from the peripheral side toward the inner side of the substrate.

(2) A semiconductor device which is formed to have a square plane and has a substrate having an interconnection formed on the first surface (chip mounting surface) of first and second opposite surfaces, a semiconductor chip which is mounted on the first surface side of the substrate and has an electrode formed on the first surface (circuit forming surface) of first and second opposite surfaces and a conductive wire for electrically connecting the electrode of the semiconductor chip and the interconnection of the substrate, wherein the interconnection has a bump connecting land for connecting a bump electrode from the second surface side of the substrate and a plurality of wire connecting pads which are arranged from the peripheral side toward the inner side of the substrate.

(3) A semiconductor device which is formed to have a square plane and has a substrate having an interconnection formed on the first surface (chip mounting surface) of first and second opposite surfaces, a semiconductor chip which is mounted on the first surface side of the substrate and has an electrode formed on the first surface (circuit forming surface) of first and second opposite surfaces, a conductive wire for electrically connecting the electrode of the semiconductor chip and the interconnection of the substrate and a resin sealing body for sealing the semiconductor chip and the wire, wherein the interconnection has a plurality of wire connecting pads which are arranged from the peripheral side toward the inner side of the substrate.

(4) A semiconductor device which is formed to have a square plane and has a substrate having an interconnection formed on the first surface (chip mounting surface) of first and second opposite surfaces, a semiconductor chip which is mounted on the first surface of the substrate and has an electrode formed on the first surface of first and second opposite surfaces, a conductive wire for electrically connecting the electrode of the semiconductor chip and the interconnection of the substrate and a resin sealing body for sealing therewith the semiconductor chip and the wire, wherein the interconnection has a bump connecting land for connecting a bump electrode from the second surface side of the substrate and a plurality of wire connecting pads which are arranged from the peripheral side toward the inner side of the substrate.

According to the above-described means (1) or (2), when a semiconductor chip having an external size smaller than an ordinary semiconductor chip of a predetermined external size is integrated in a semiconductor, it is possible to select a proper wire connecting pad from those arranged from the peripheral side toward the inner side of the substrate so as to shorten the wire length according to the external size of the semiconductor chip, which makes it possible to suppress the wire length which otherwise increases with a decrease in the external size of the semiconductor chip, leading to suppression of an increase in the wire sagging. As a result, in the wire bonding step for connecting the electrode of the semiconductor chip with the wire connecting pad of the interconnection via a wire, short-circuit between the wire and the interconnection can be suppressed, which makes it possible to produce a semiconductor device without lowering the yield even when the semiconductor chip smaller in external size than the ordinary semiconductor chip is integrated.

According to the above-described means (3) or (4), when a semiconductor chip having an external size smaller than an ordinary semiconductor chip of a predetermined external size is integrated in a semiconductor, it is possible to select a proper wire connecting pad from those arranged from the peripheral side toward the inner side of the substrate so as to shorten the wire length according to the external size of the semiconductor chip, which makes it possible to suppress the wire length which otherwise increases with a decrease in the external size of the semiconductor chip, leading to suppression of an increase in the wire sagging. As a result, in the step for sealing the semiconductor chip and the wire with a resin sealing body, the flow of the wire caused by the insulating resin injected upon pressure can be suppressed and therefore, the occurrence of a short-circuit between two adjacent wires can be suppressed, which makes it possible to produce a semiconductor device without lowering the production yield even in the case where a semiconductor chip smaller in external size than an ordinary semiconductor chip is integrated.

According to any one of the above-described means (1) to (4), when a semiconductor chip having an external size smaller than an ordinary semiconductor chip of a predetermined external size is integrated in a semiconductor, it is possible to select a proper wire connecting pad from those arranged from the peripheral side toward the inner side of the substrate so as to shorten the wire length according to the external size of the semiconductor chip, which makes it possible to suppress the wire length which otherwise increases with a decrease in the external size of the semiconductor chip. As a result, an increase in the inductance can be suppressed, which makes it possible to produce a semiconductor device without deteriorating its electrical properties even in the case where a semiconductor chip smaller in external size than an ordinary semiconductor chip is integrated in it.

DESCRIPTION OF THE PREFERRED EMBODIMENTS

Figure 1:
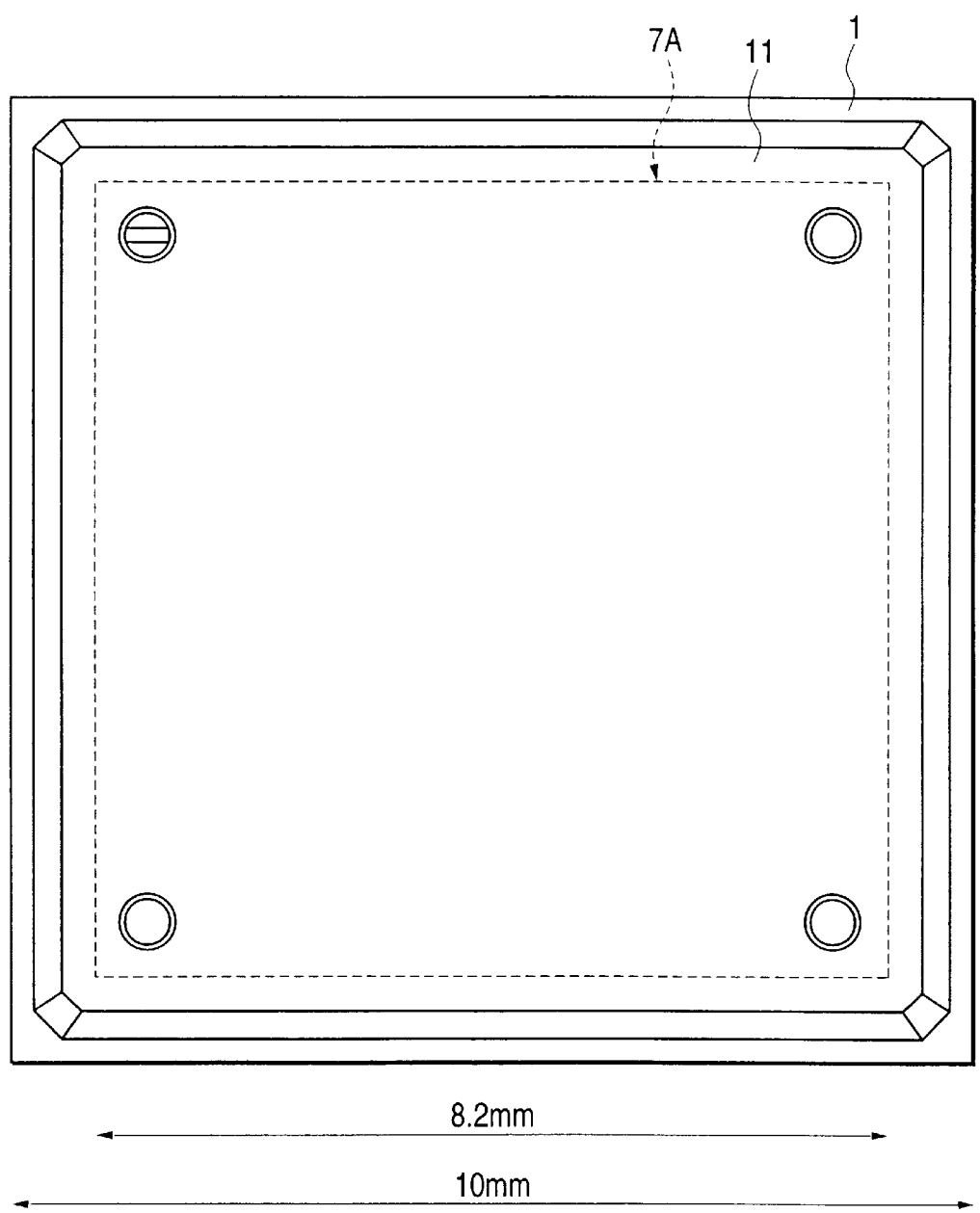
FIG. 1 is a plan view illustrating a semiconductor device having, integrated therein, a semiconductor chip having an ordinary external size according to Embodiment 1 of the present invention.

Embodiments of the present invention will be described more specifically with reference to accompanying drawings. In all the drawings illustrating the embodiments of the present invention, like elements having the same function will be identified by like reference numerals and overlapping description will be omitted.

(Embodiment 1)

Figure 2:
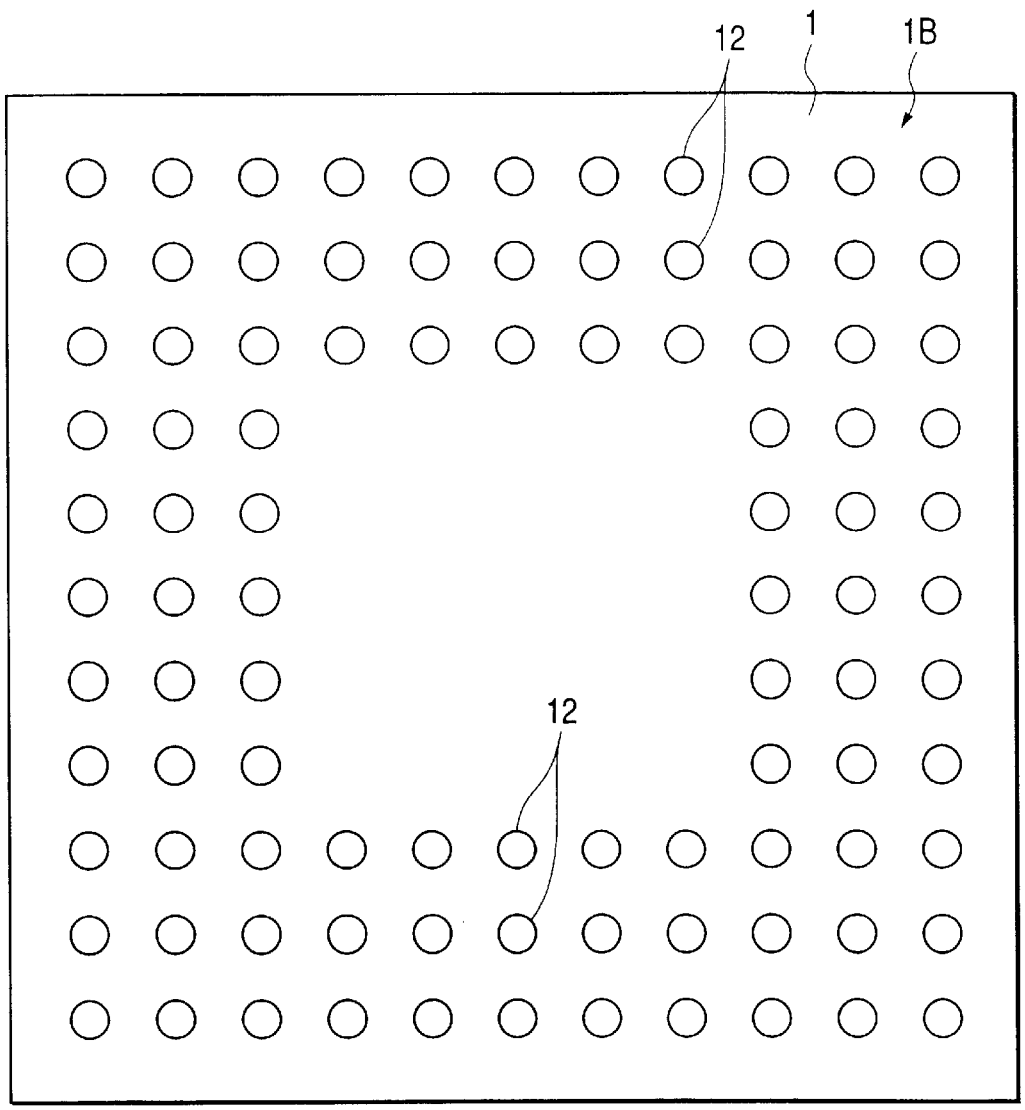
FIG. 2 is a bottom view of the semiconductor device according to Embodiment 1 of the present invention.
Figure 3:
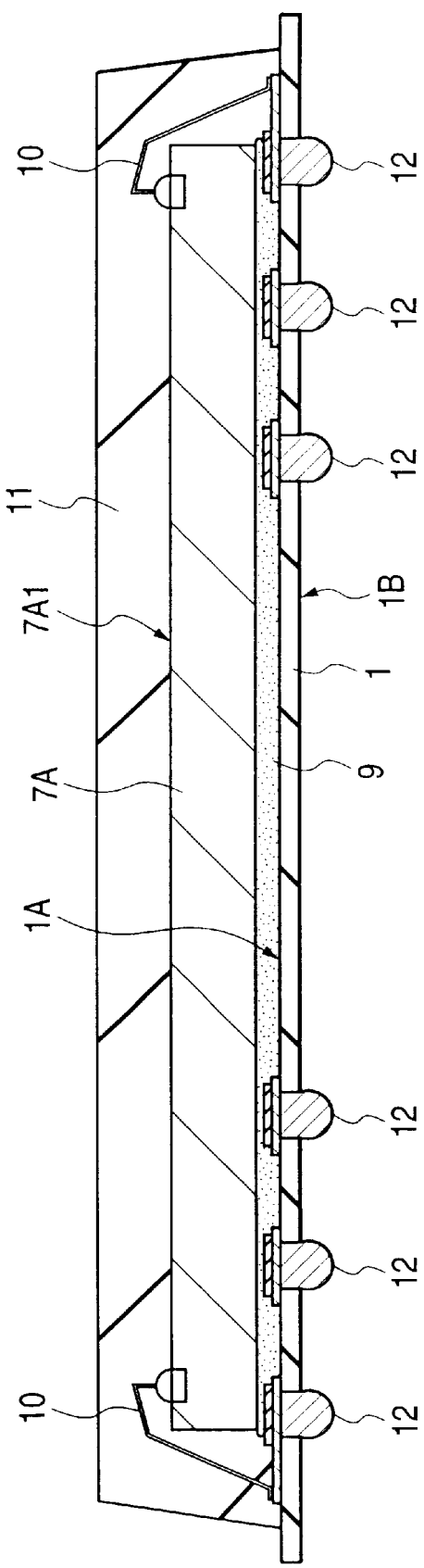
FIG. 3 is a cross-sectional view of the semiconductor device according to Embodiment 1 of the present invention.
Figure 4:
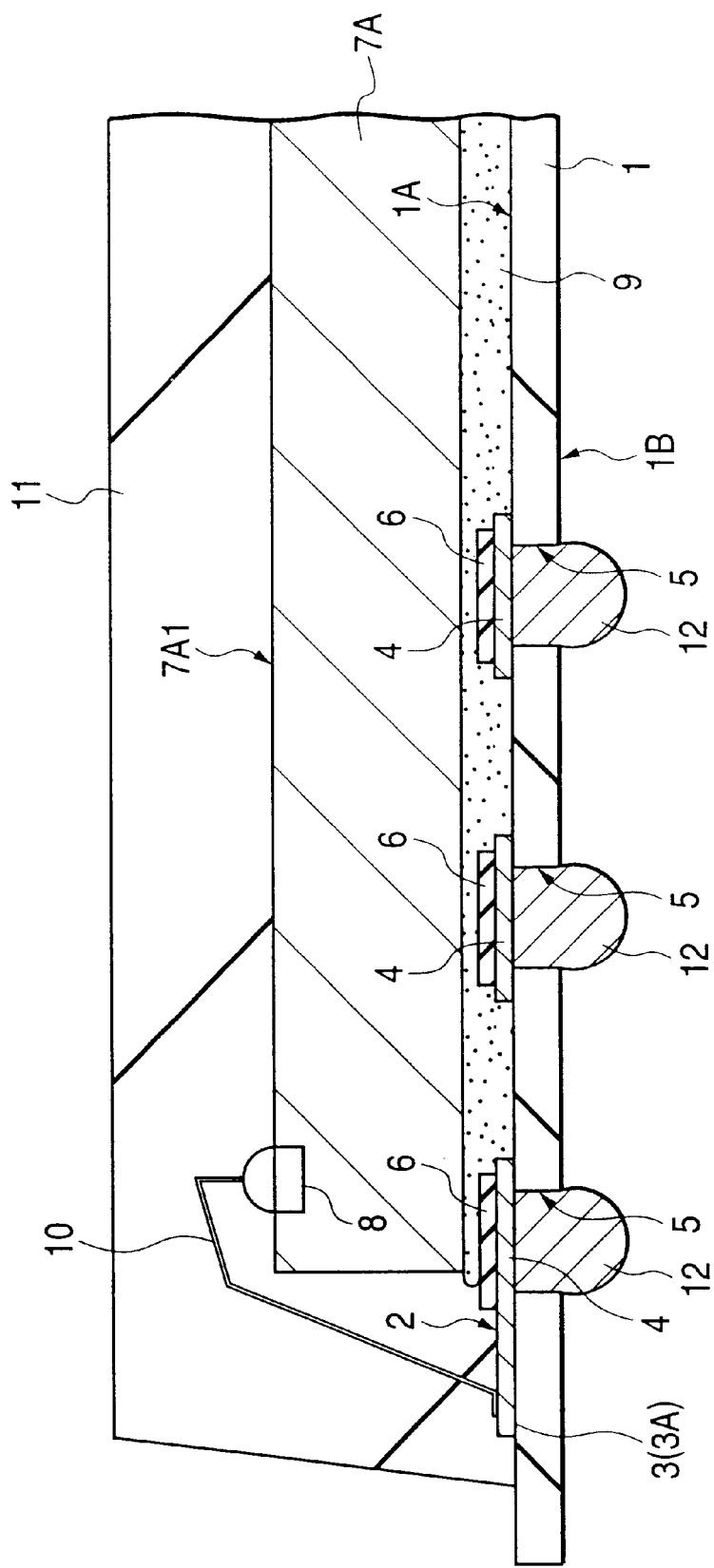
FIG. 4 is a partially enlarged cross-sectional view of FIG. 3.
Figure 5:
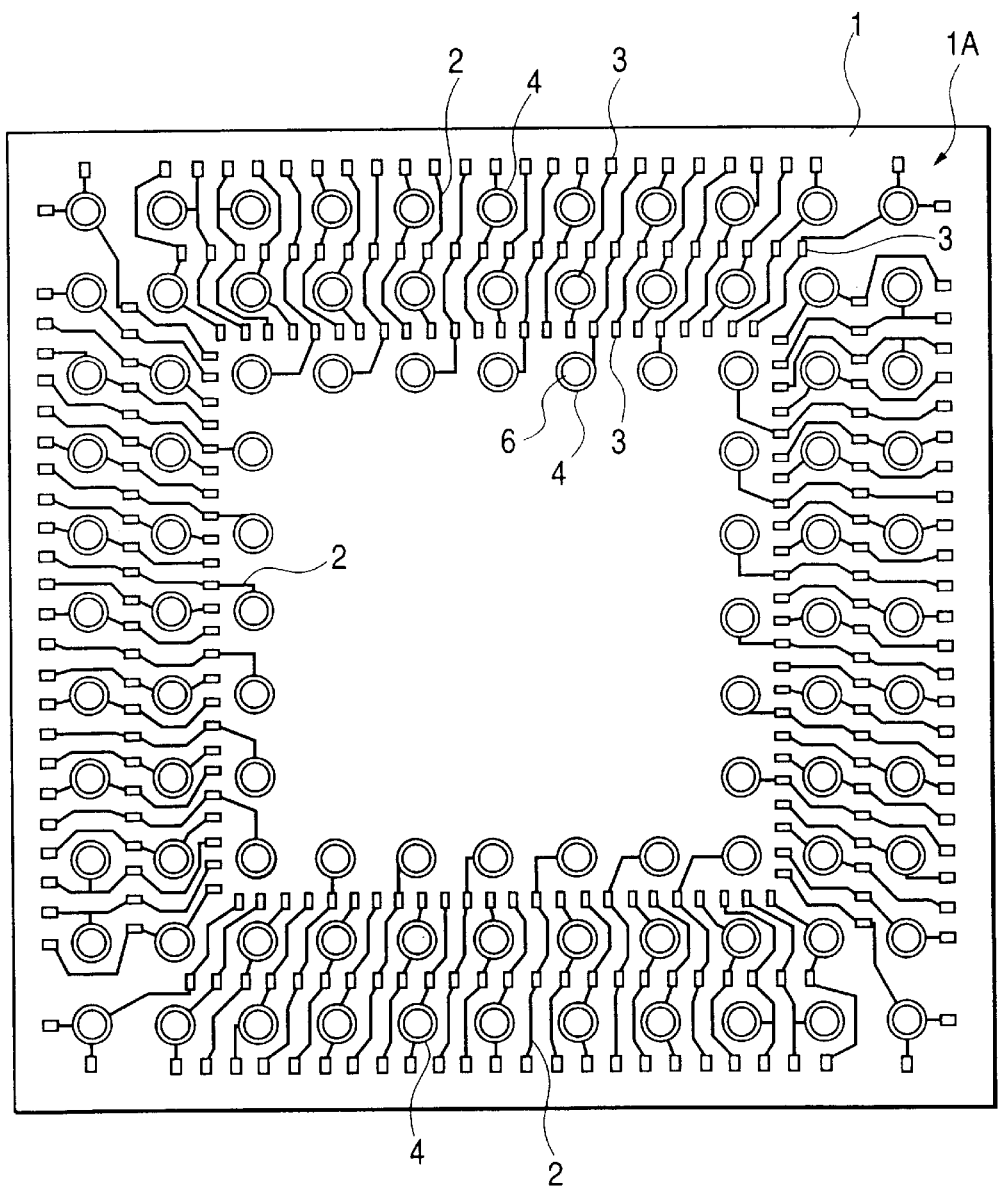
FIG. 5 is a plan view illustrating the substrate of the semiconductor device according to Embodiment 1.
Figure 6:
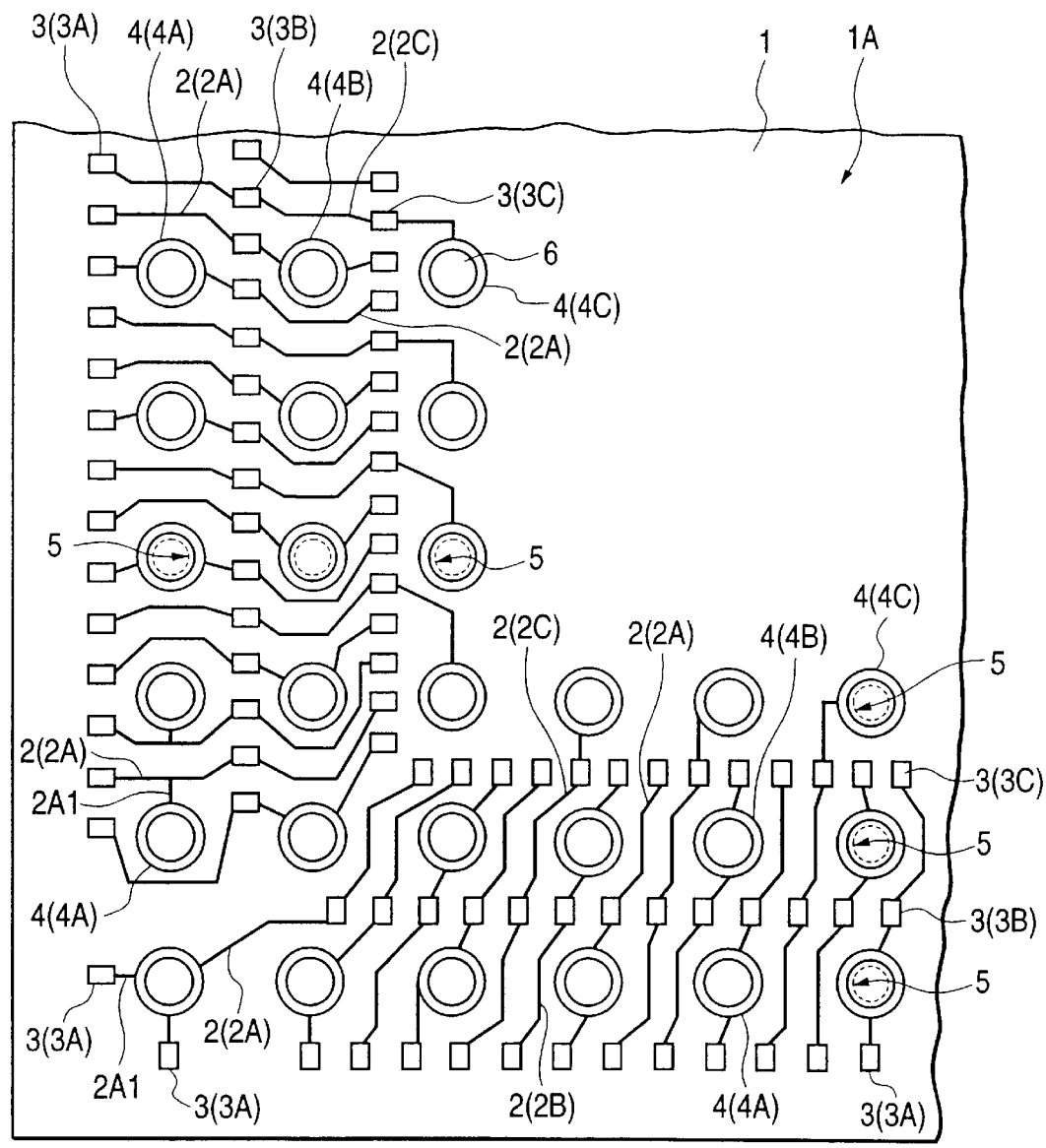
FIG. 6 is a partially enlarged plan view of FIG. 5.
Figure 7:
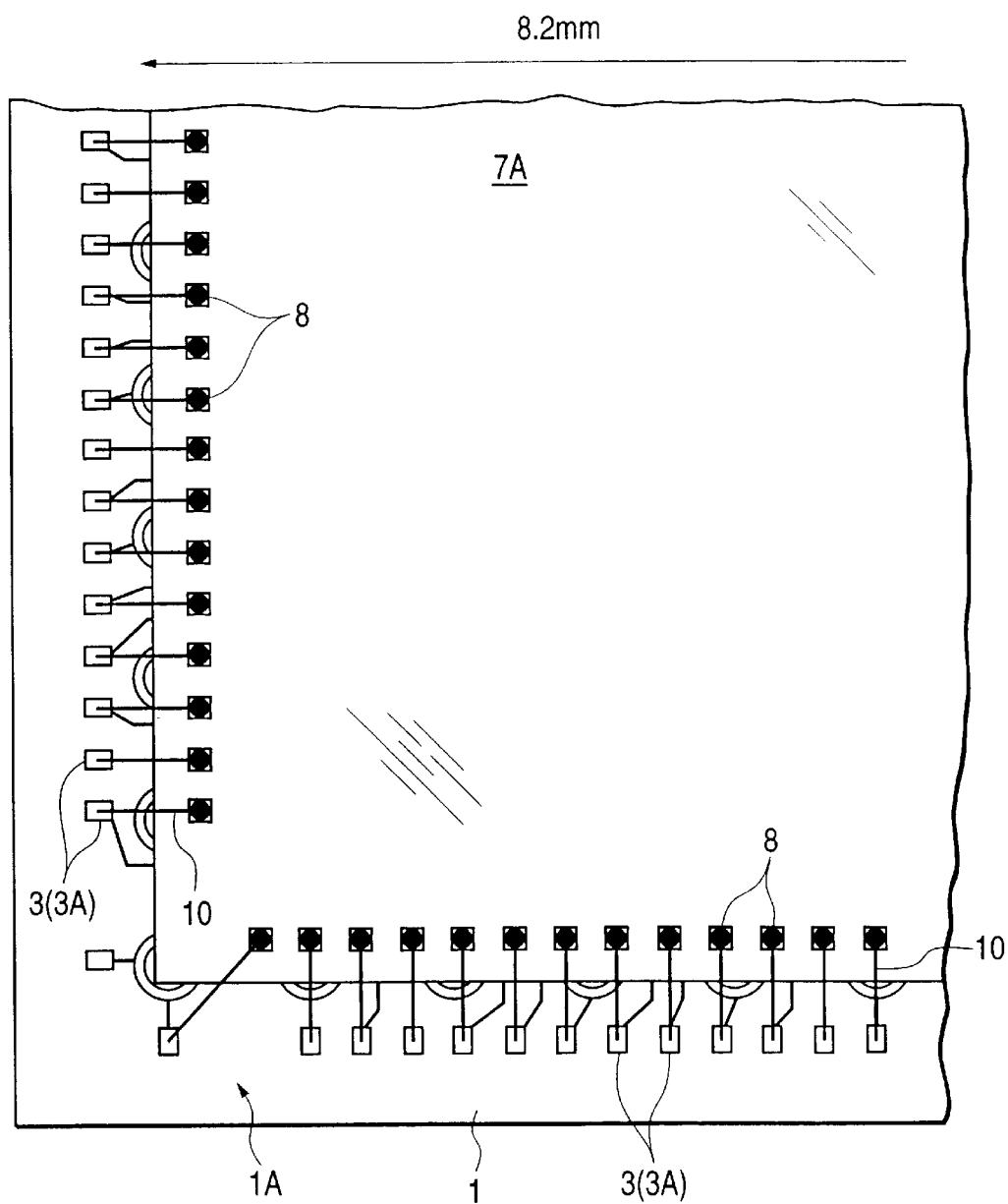
FIG. 7 is a fragmentary plan view illustrating the semiconductor device according to Embodiment 1 of the present invention from which a resin sealing body has been removed.
Figure 8:
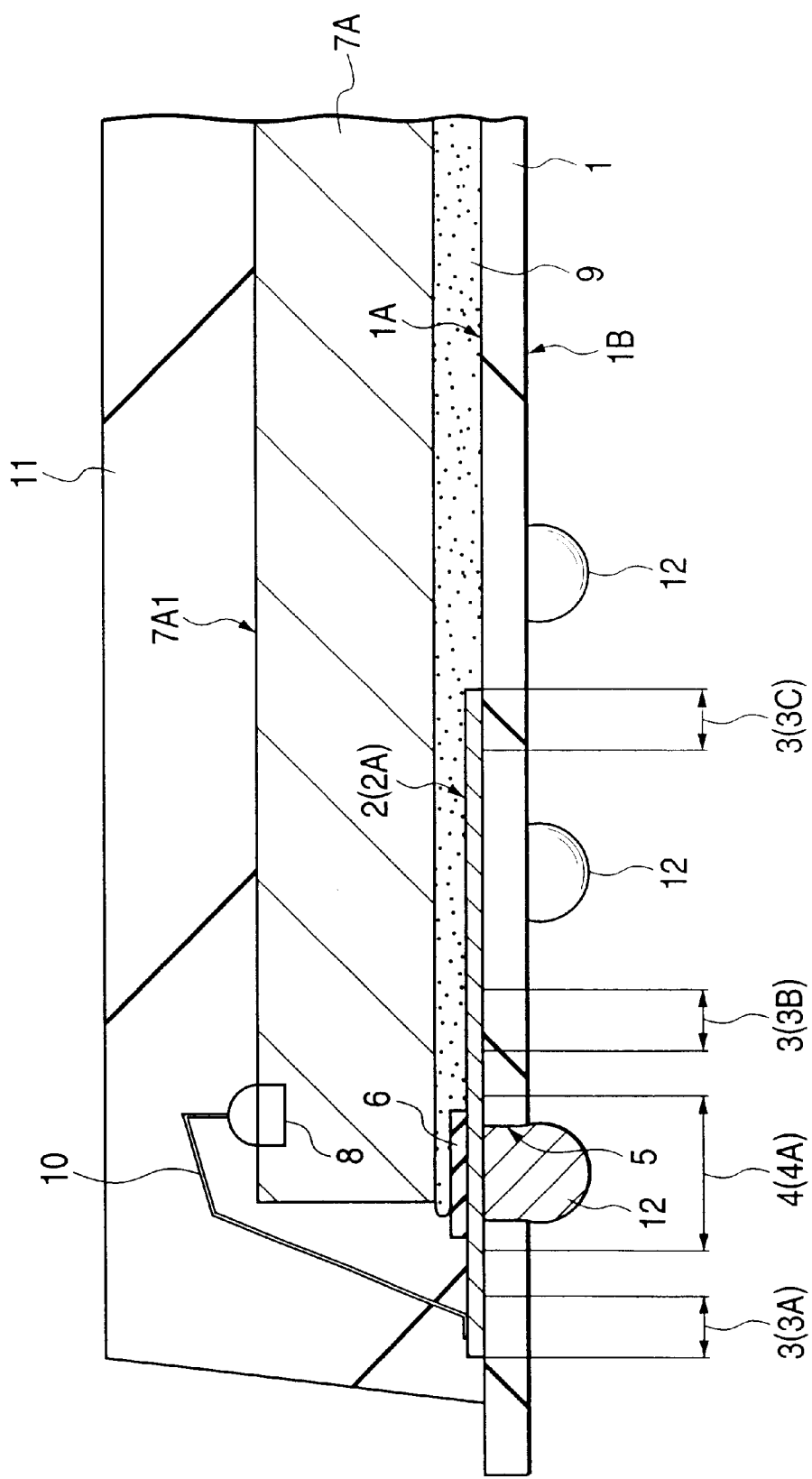
FIG. 8 is a fragmentary cross-sectional view illustrating the semiconductor device according to Embodiment 1 of the present invention.
Figure 9:
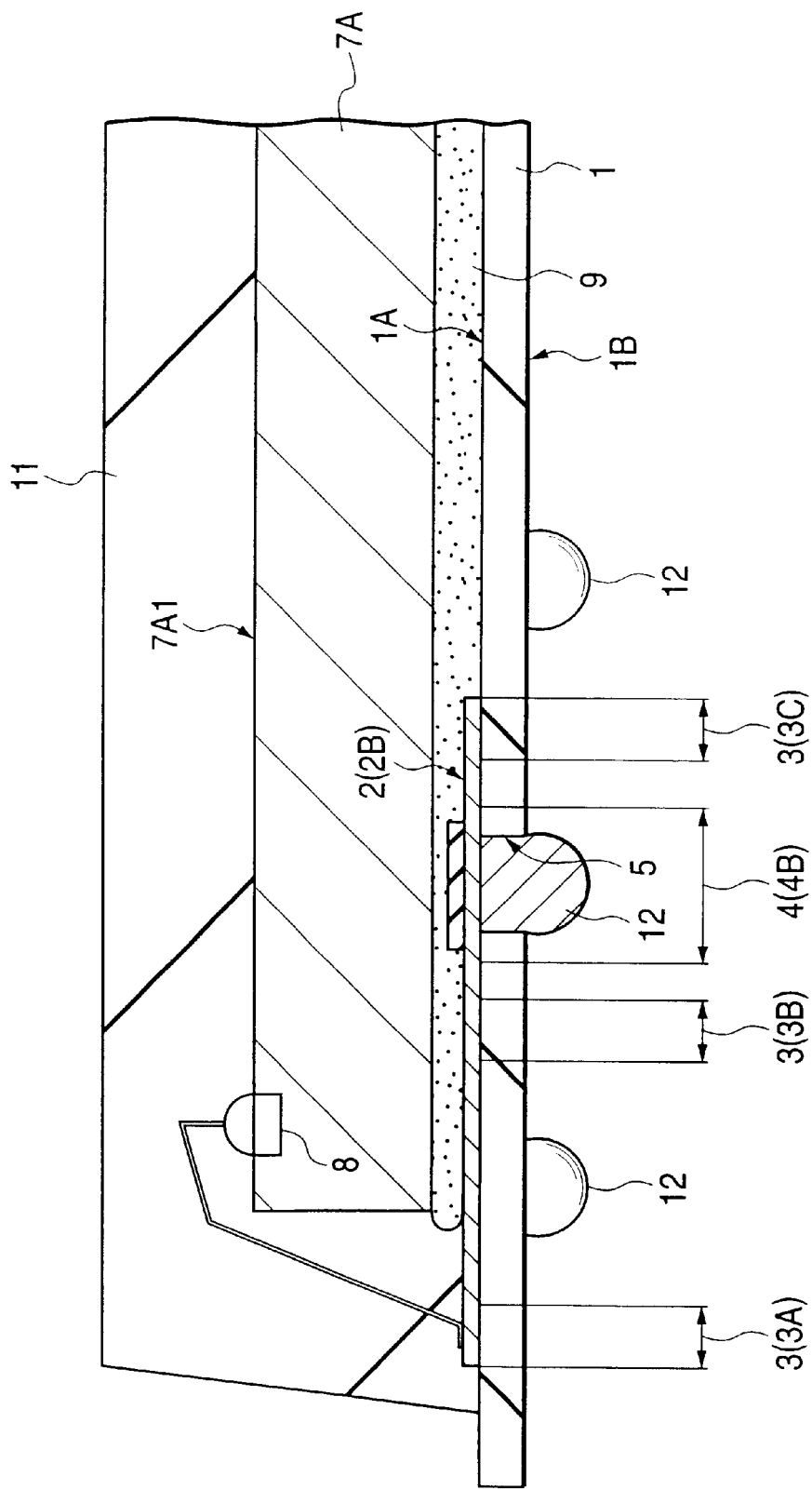
FIG. 9 is a fragmentary cross-sectional view illustrating the semiconductor device according to Embodiment 1 of the present invention.
Figure 10:
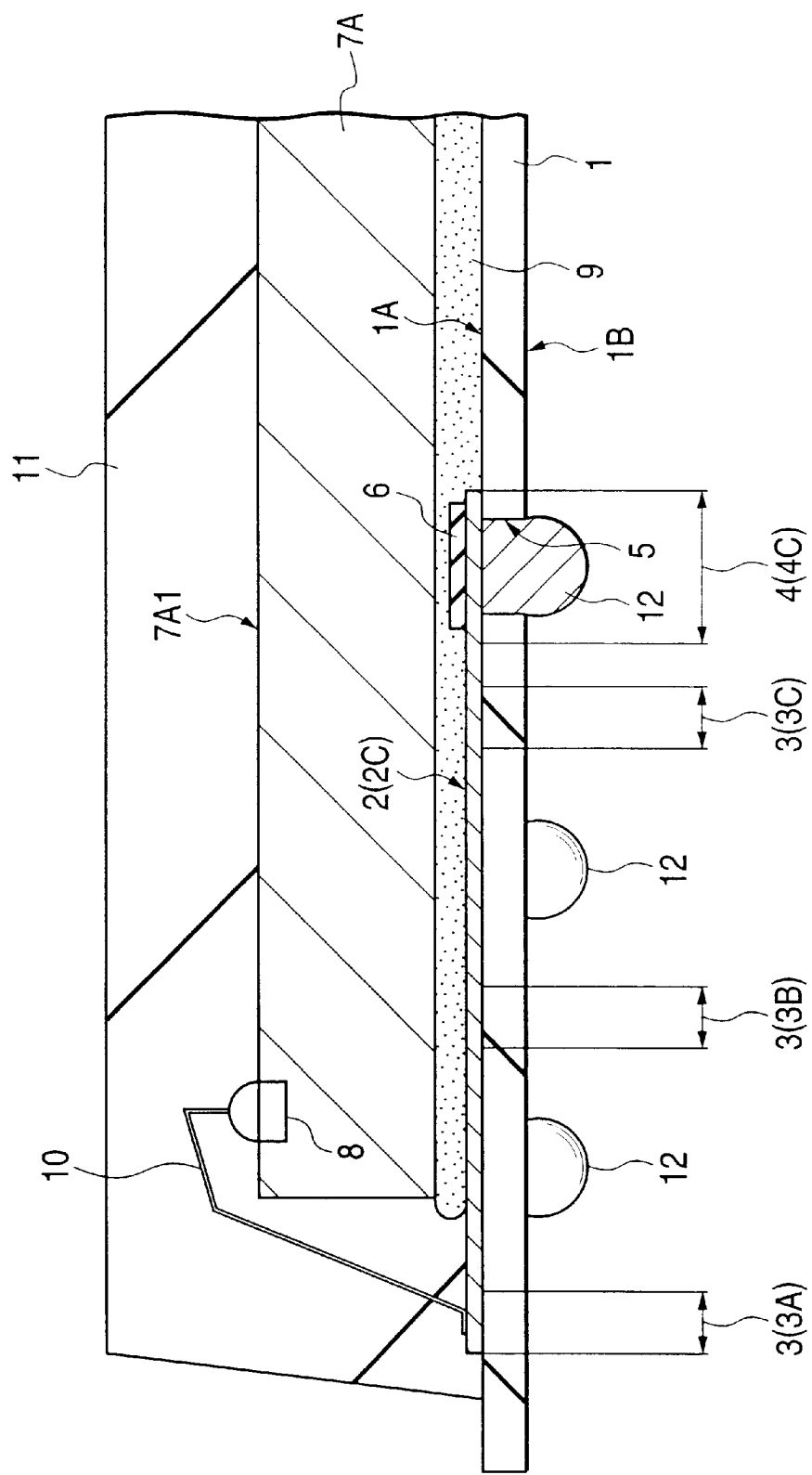
FIG. 10 is a fragmentary cross-sectional view illustrating the semiconductor device according to Embodiment 1 of the present invention.

FIG. 1 is a plan view illustrating a semiconductor device having, integrated therein, a semiconductor chip having an ordinary external size according to Embodiment 1 of the present invention; FIG. 2 is a bottom view of the above-described semiconductor device; FIG. 3 is a cross-sectional view of the above-described semiconductor device; FIG. 4 is a partially enlarged cross-sectional view of FIG. 3; FIG. 5 is a plan view illustrating the substrate of the above-described semiconductor device; FIG. 6 is a partially enlarged view of FIG. 5; FIG. 7 is a fragmentary plan view illustrating the above-described semiconductor device from which a resin sealing body has been removed; and FIGS. 8 to 10 are each a fragmentary cross-sectional view of the above-described semiconductor device.

As illustrated in FIGS. 1 to 3, the semiconductor device of this Embodiment has an ordinary semiconductor chip 7A, which has a predetermined external size, mounted on the side of the chip mounting surface 1A which is the first surface (one main surface) of first and second opposite surfaces (one main surface and the other main surface opposite to each other) of a substrate (interconnection substrate) 1 and a plurality of bump electrodes (external terminals) 12 disposed, as externally connecting terminals, on the side of the second surface (the other main surface) 1B of the substrate 1.

The planar shape of the semiconductor chip 7A is a square (rectangular) and in this Embodiment, it is a regular square of 8.2 [mm]×8.2 [mm] for example (see FIG. 1). The planar shape of the substrate 1 is also a square and in this Embodiment, it is a regular square of 10 [mm]×10 [mm] (see FIG. 1). In other words, the semiconductor device according to this Embodiment has a CSP type structure.

A plurality of bump electrodes 12, but not limited thereto, are arranged in three rows along each side of the outer periphery of the substrate 1 on the second surface 1B of the substrate 1 other than the central portion. Each of the plurality of bump electrodes 12 is formed of a metal material having, for example, a composition of 63 [wt. %] lead (Pb)–37 [wt. %] tin (Sn). The plurality of bump electrodes 12 are arranged, for example, with a pitch of 0.8 [mm].

The semiconductor chip 7A is mounted on the side of a chip mounting surface 1A of the substrate 1 via an adhesive 9 with the circuit forming surface 7A1, which is a first surface (one main surface) of first and second opposite surfaces (one main surface and the other main surface opposite to each other), up. The semiconductor chip 7A is formed mainly of a semiconductor substrate made of, for example, single crystal silicon, and an insulating layer and an interconnection layer formed on this substrate. As the adhesive 9, an adhesive made of, for example, an epoxy or polyimide thermosetting insulating resin is employed.

The semiconductor chip 7A has, for example, a logical circuit system as a circuit system. This logical circuit system is formed mainly of a transistor element formed on the main surface of the semiconductor substrate and an interconnection formed on the interconnection layer.

On the circuit forming surface 7A1 of the semiconductor chip 7A, a plurality of electrodes (bonding pads) 8 are formed along each side of the outer periphery of the semiconductor chip 7A. Each of the plurality of electrodes 8 is formed on the topmost layer of the interconnection layers of the semiconductor chip 7A and is electrically connected, via the interconnection, with the transistor element constituting the circuit system. Each of the plurality of electrodes 8 is formed, for example, of a metal film made of aluminum (Al), an aluminum alloy or the like.

The substrate 1 is made of an epoxy or polyimide insulating resin and it is, for example, formed of a plastic film having a thickness of about 50 [μm]. On the chip mounting surface 1A of the substrate 1, a plurality of interconnections 2 are formed as illustrated in FIG. 5. Each of the plurality of interconnections 2 are arranged along each side of the outer periphery of the substrate 1 and extends mainly from the peripheral side to the inner side of the substrate 1.

Each of the plurality of interconnections 2 has, as illustrated in FIGS. 5 and 6, one bump connecting land (bump connecting portion) 4 and a plurality of wire connecting pads (wire connecting portions) arranged from the peripheral side toward the inner side of the substrate 1. In this Embodiment, each of the plurality of the interconnections 2 has three wire connecting pads 3. Each of the wire connecting pads 3 is wider than the connecting portion (interconnection portion) of the interconnection 2 and is formed to have a square planar shape. The bump connecting land 4 is wider than the connecting portion of the interconnection 2 and is formed to have a circular planar shape.

As illustrated in FIG. 6, the wire connecting pads 3A at the first position from the outermost periphery of the substrate 1, among three wire connecting pads 3 formed for each interconnection 2, are arranged in a row along each side of the outer periphery of the substrate 1 and constitute a first pad row. The wire connecting pads 3B at the second position from the outermost periphery of the substrate 1, among three wire connecting pads 3 formed in each interconnection 2, are arranged in a row along each side of the outer periphery of the substrate 1 and constitute a second pad row. The wire connecting pads 3C at the third position from the outermost periphery of the substrate 1, among three wire connecting pads 3 formed in each interconnection 2, are arranged in a row along each side of the outer periphery of the substrate 1 and constitute a third pad row. These three pad rows are arranged, for example, with a pitch of 0.8 [mm] from the peripheral side toward the inner side of the substrate 1.

With the bump connecting land 4 of each of the plurality of interconnections 2, as illustrated in FIG. 4, a bump electrode 12 is electrically and mechanically connected from the second surface side 1B of the substrate 1 through a connecting hole (through hole) 5 formed in the substrate 1. In other words, the bump connecting land 4 of each of the plurality of the interconnections 2 is disposed so as to fill the connecting hole 5 of the substrate 1.

On the surface (upper surface) of the bump connecting land 4 of each of the plurality of interconnections 2, as illustrated in FIGS. 4 and 6, an insulating film 6 is formed in order to prevent a contact with the semiconductor chip 7A. This insulating film 6 is formed, for example, of an insulating resin.

Each of the electrodes 8 on the semiconductor chip 7A is, as illustrated in FIG. 4, electrically connected with each of the interconnections 2 on the substrate 1 via a wire 10. Described specifically, as illustrated in FIG. 7, the wire 10 is connected, at one end thereof, with the electrode 8 of the semiconductor chip 7A and, at the other end, with the wire connecting pad 3A which is located at the outermost position among the three wire connecting pads 3 of the interconnection 2. In short, the semiconductor device according to this Embodiment has a face up structure. As the wire 10, for example, a gold (Au) wire is employed. The wire 10 is connected, for example, by using thermo-compression bonding and ultrasonic vibration in combination.

The semiconductor chip 7A, wire 10 and the like are, as illustrated in FIGS. 1, 3 and 4, sealed with a resin sealing body (resin body) 11 formed on the side of the chip mounting surface 1A of the substrate 1. For stress reduction, the resin sealing body 11 is made of, for example, a biphenyl insulating resin to which have been added a phenol curing agent, silicone rubber, filler and the like. This resin sealing body 11 is, for example, formed by the transfer molding method suited for mass production. Roughly speaking, in the transfer molding method, a resin sealing body is formed using a mold equipped with a pot, runner, inflow gate, cavity and the like and injecting, under pressure, an insulating resin from the pot to the runner and then inflow gate and finally into the cavity.

As illustrated in FIGS. 6 and 8, a bump connecting land 4A of an interconnection 2A, among the plurality of interconnections 2, is disposed between a wire connecting pad 3A and wire connecting pad 3B. In other words, the interconnection 2A has wire connecting pads 3A, 3B and 3C which are arranged successively from the peripheral side toward the inner side of the substrate 1 and is formed to have, between the wire connecting pad 3A and wire connecting pad 3B, the bump connecting land 4A to be connected with the bump electrode 12 from the side of the second surface 1B of the substrate 1.

As illustrated in FIGS. 6 and 9, a bump connecting land 4B of an interconnection 2B, among the plurality of interconnections 2, is disposed between the wire connecting pad 3B and wire connecting pad 3C. In other words, the interconnection 2B has the wire connecting pads 3A, 3B and 3C which are arranged successively from the peripheral side toward the inner side of the substrate 1 and is formed to have, between the wire connecting pad 3B and wire connecting pad 3C, the bump connecting land 4B to be connected with the bump electrode 12 from the side of the second surface 1B of the substrate 1.

As illustrated in FIGS. 6 and 10, a bump connecting land 4C of an interconnection 2C, among the plurality of interconnections 2, is disposed at a position farther than the wire connecting pad 3C from the wire connecting pad 3B. In other words, the interconnection 2C has the wire connecting pads 3A, 3B and 3C which are arranged successively from the peripheral side toward the inner side of the substrate 1 and is formed to have, at a position farther than the wire connecting pad 3C from the wire connecting pad 3B, the bump connecting land 4C to be connected with the bump electrode 12 from the side of the second surface 1B of the substrate 1.

As illustrated in FIG. 6, the bump connecting lands 4A of the interconnections 2A are arranged in a row along each side of the outer periphery of the substrate 1 and constitute a first land row. The bump connecting lands 4B of the interconnections 2B are arranged in a row along each side of the outer periphery of the substrate 1 and constitute a second land row. The bump connecting lands 4C of the interconnections 2C are arranged in a row along each side of the outer periphery of the substrate 1 and constitute a third land row. In other words, on the chip mounting surface 1A of the substrate 1, successively formed from the peripheral side to the inner side of the substrate 1 are the first pad row formed of a plurality of wire connecting pads 3A, the first land row formed of a plurality of bump connecting lands 4A, the second pad row formed of a plurality of wire connecting pads 3B, the second land row formed of a plurality of bump connecting lands 4B, the third pad row formed of a plurality of wire connecting pads 3C and the third land row formed of a plurality of bump connecting lands 4C.

As illustrated in FIG. 6, some interconnections 3A, among the plurality of interconnections 3A, each has a branch line 2A1 branched from the main line and in this branch line 2A1, a bump connecting land 4A is formed. Some interconnections 3A, among the plurality of interconnections 3A, each has a branch line 2A1 branched from the main line and in this branch line 2A1, another wire connecting pad 3A is formed.

In the semiconductor device according to this Embodiment, the substrate 1 formed of a plastic film is employed. This substrate 1 is formed by cutting out a substrate forming region from the plastic film. On the substrate forming region of the plastic film, interconnection patterns as illustrated in FIG. 5, that is, a plurality of interconnections 2 are formed in advance. In addition, on the substrate forming region of the plastic film, the connecting holes 5 as illustrated in FIG. 4 are formed in advance. The plurality of interconnections 2 are formed by adhering a metal foil made of, for example, copper (Cu) to one side of the plastic film via an adhesive layer and then etching the metal foil. The connecting holes 5 are formed by, subsequent to the formation of the adhesive layer for adhering the metal foil to one side of the plastic film, subjecting the substrate forming region of the resulting plastic film to punching or laser processing.

Figure 11:
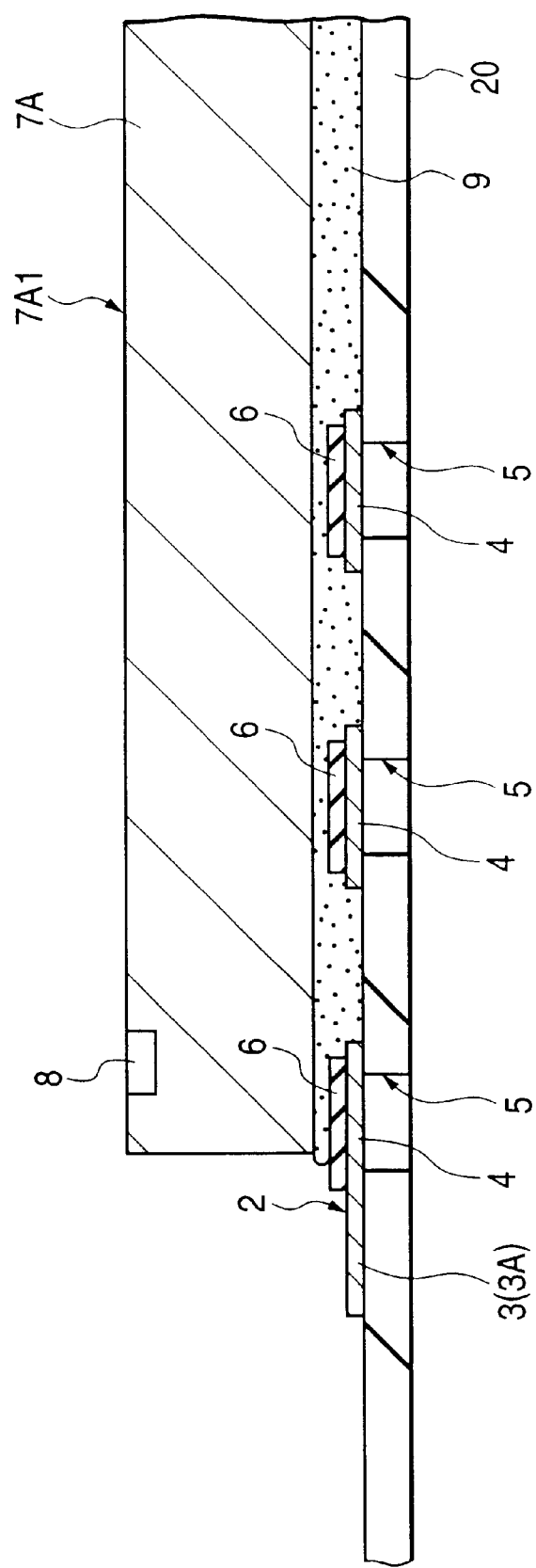
FIG. 11 is a fragmentary cross-sectional view illustrating the production process of the semiconductor device according to Embodiment 1 of the present invention.
Figure 12:
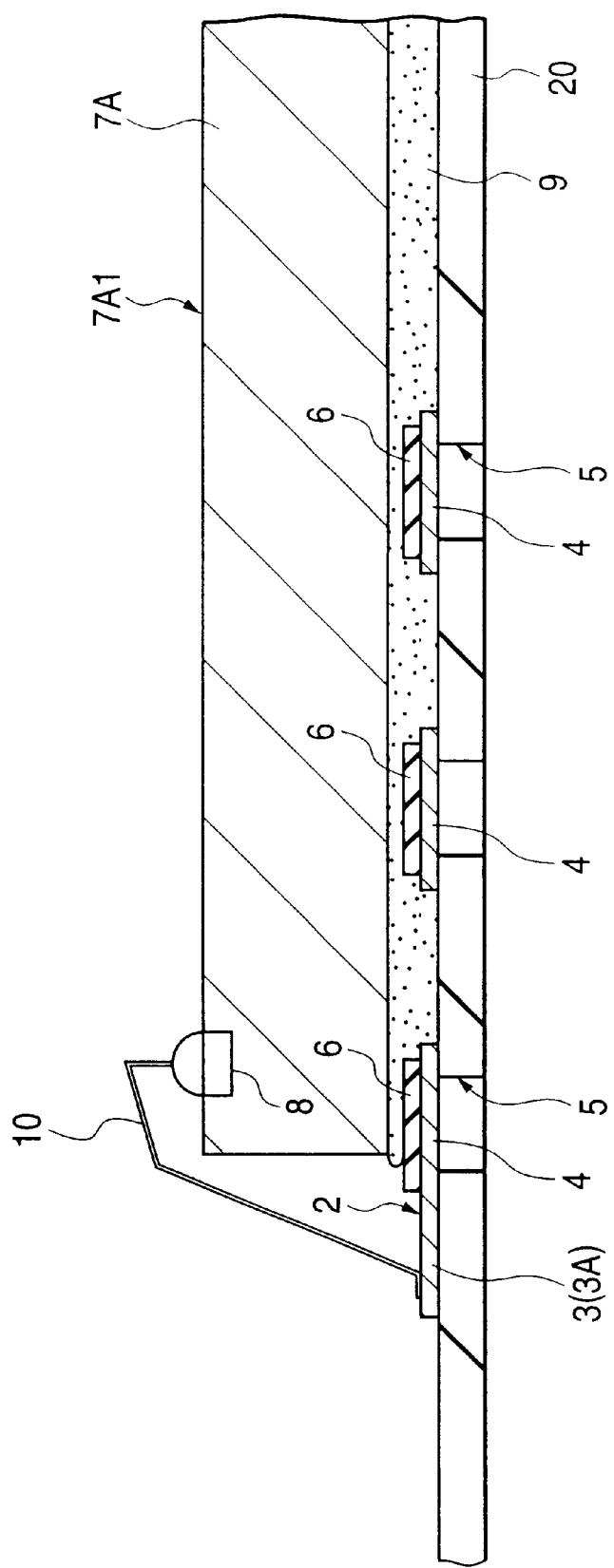
FIG. 12 is a fragmentary cross-sectional view illustrating the production process of the semiconductor device according to Embodiment 1 of the present invention.
Figure 13:
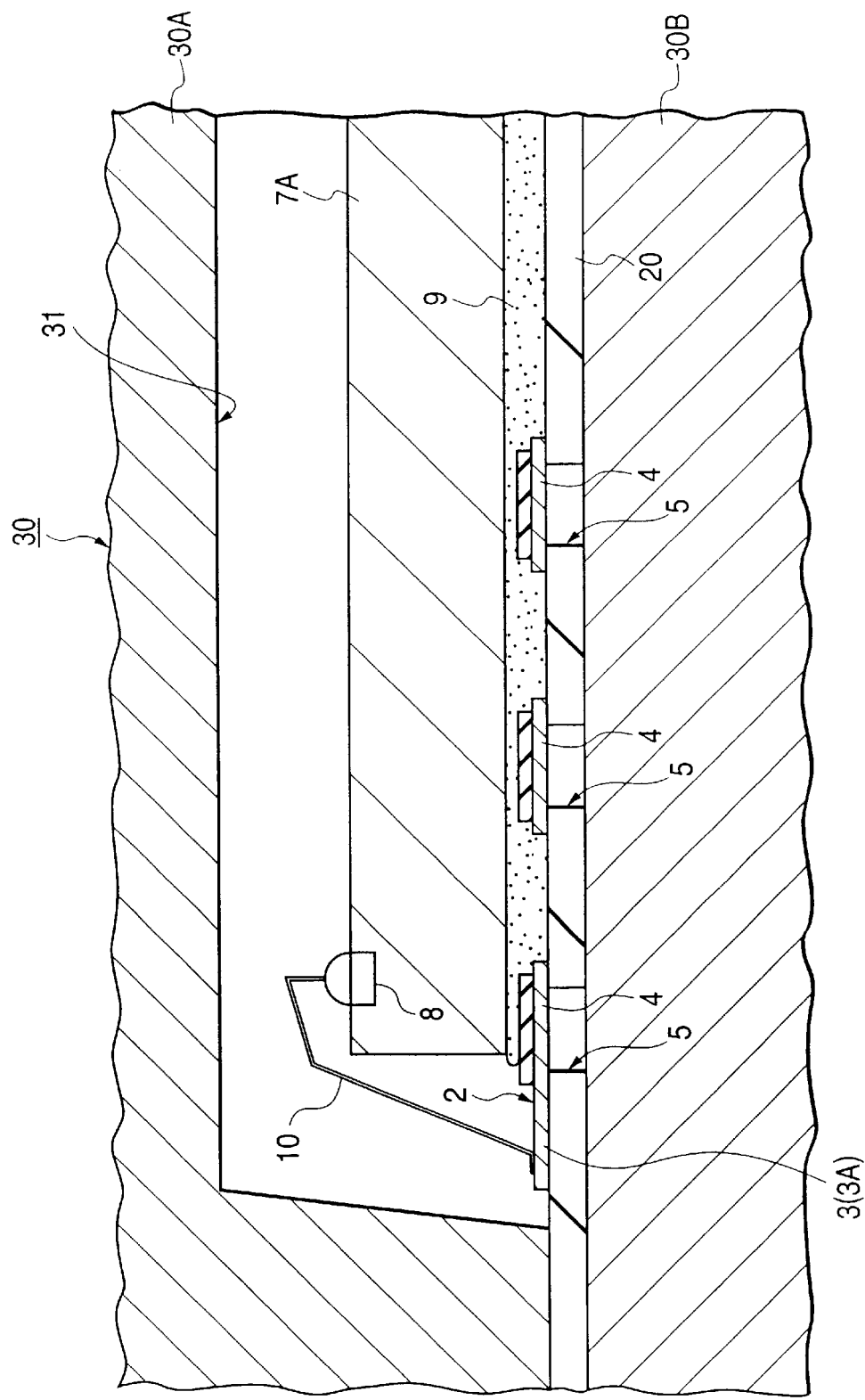
FIG. 13 is a fragmentary cross-sectional view illustrating the production process of the semiconductor device according to Embodiment 1 of the present invention.

A description will next be made of the production process of the semiconductor device according to this Embodiment with reference to FIGS. 11 to 13. FIGS. 11 to 13 are fragmentary cross-sectional views illustrating the production process of the semiconductor device.

First, a plastic film 20 is prepared. On the chip mounting surface of the substrate forming region of the plastic film 20, interconnection patterns as illustrated in FIG. 5 and connecting holes 5 as illustrated in FIG. 3 are formed in advance.

On the side of the chip mounting surface of the substrate forming region of the plastic film 20, a semiconductor chip 7A having an ordinary external size (8.2 [mm]×8.2 [mm]) is mounted via an adhesive 9. The semiconductor chip 7A is mounted with its circuit forming surface 7A1 up. This step is illustrated in FIG. 11.

Then, an electrode 8 of the semiconductor chip 7A is electrically connected with an interconnection 2 formed on the chip mounting surface of the substrate forming region of the plastic film 20 with a conductive wire 10. In this step, the wire 10 is connected, at one end thereof, with the electrode 8 of the semiconductor chip 7A and, at the other end, with the wire connecting pad 3A located at the outermost position among the three wire connecting pads 3 of the interconnection 2. This step is illustrated in FIG. 12.

Then, a mold 30 equipped mainly with a pot, a runner, an inflow gate and a cavity is prepared. The plastic film 20 is positioned between the top force 30A and the bottom force 30B of the mold 30. At this time, inside of the cavity 31 defined by the upper force 30A and the bottom force 30B, the substrate forming region of the plastic film 20, the semiconductor chip 7A, the wire 10 and the like are disposed. This step is illustrated in FIG. 13.

Then, an insulating resin is injected under pressure from the pot to the runner, the inflow gate and then to the cavity 31 of the mold 30, whereby a resin sealing body 11 is formed. At this time, the semiconductor chip 7A, wire 8 and the like are sealed with the resin sealing body 11.

The plastic film 20 is taken out of the mold 30, followed by the formation, through the connecting hole 5 formed in the substrate forming region of the plastic film 20, of a bump electrode 12 to be connected with a bump connecting pad 4 of the interconnection 2 from the second surface side of the plastic film 20. The bump electrode 12 is formed, for example, by turning the plastic film to make the second surface up, feeding the connecting hole 5 of the plastic film 20 with a ball-like metal material by the ball feeding method, transferring the plastic film 20 to an infrared reflow oven and then melting the ball-like metal material.

The substrate forming region was then cut out from the plastic film 20, whereby a semiconductor device having the substrate 1 made of a plastic film is substantially completed.

A description will next be made of a semiconductor device having, integrated therein, a semiconductor chip smaller in external size than the semiconductor chip 7A having an ordinary external size, based on FIGS. 14 to 21.

Figure 14:
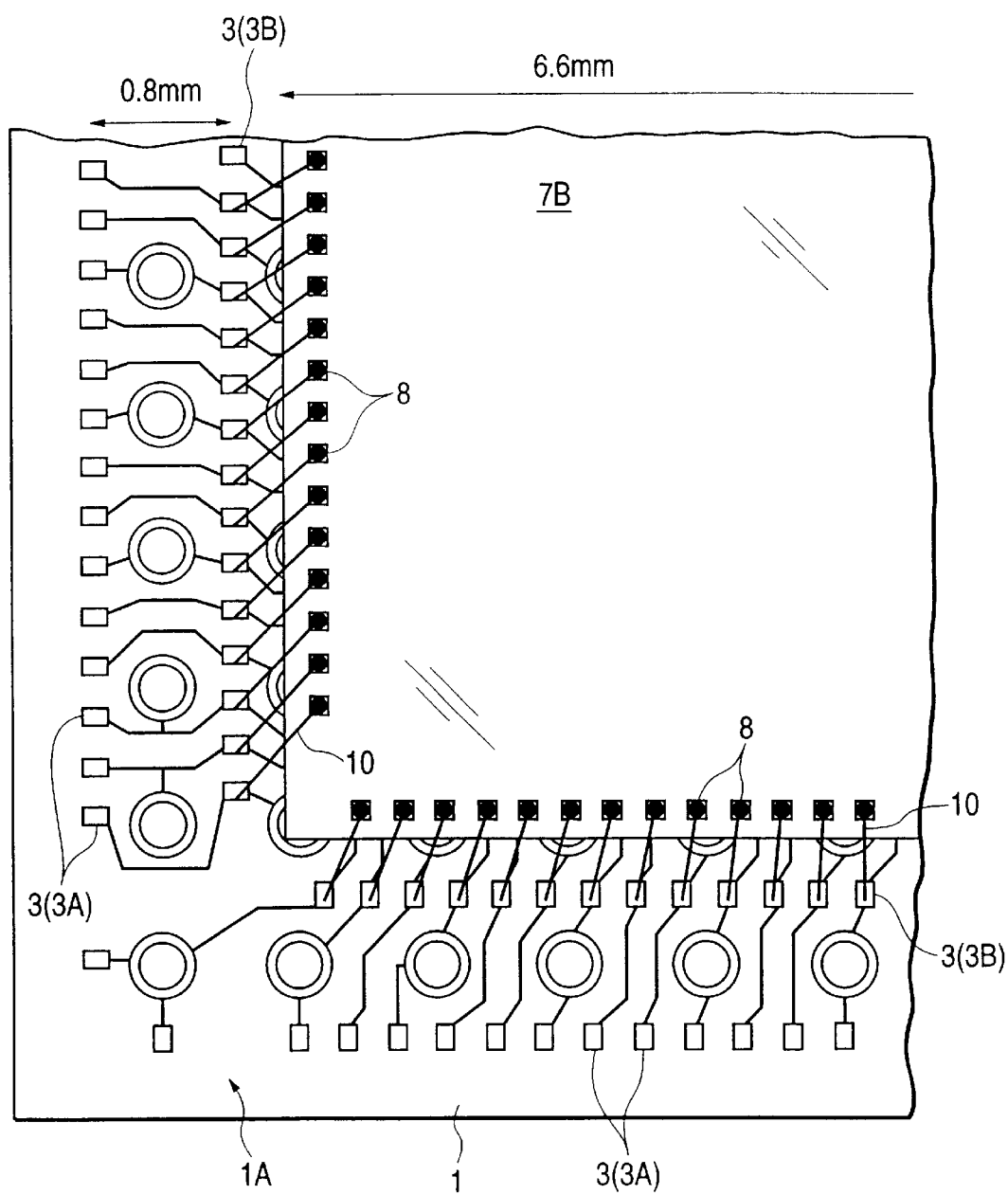
FIG. 14 is a fragmentary plan view illustrating the integrated state of a first semiconductor chip having a smaller external size than an ordinary semiconductor chip.
Figure 15:
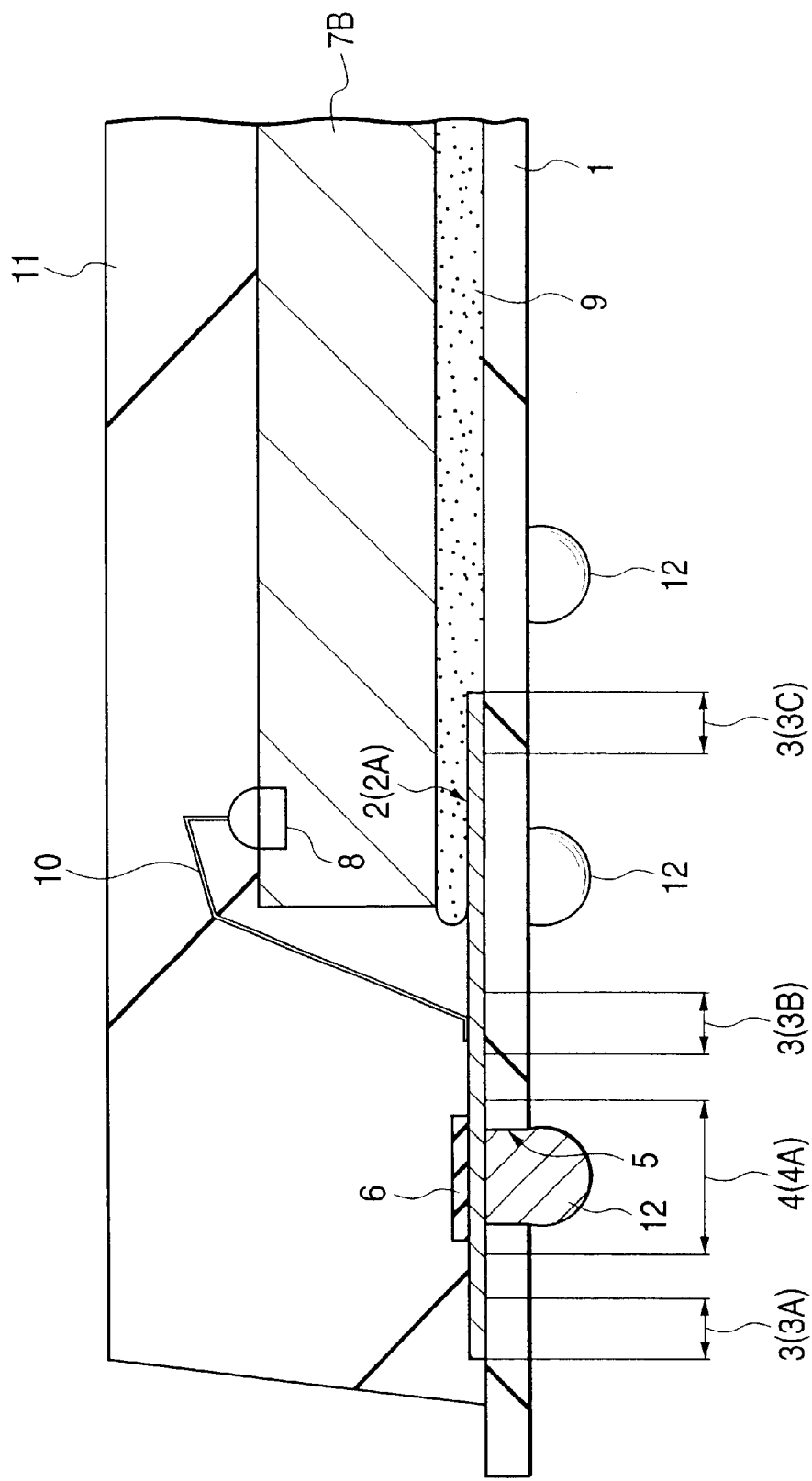
FIG. 15 is a first fragmentary cross-sectional view illustrating the integrated state of the first semiconductor chip having a smaller external size than an ordinary semiconductor chip.
Figure 16:
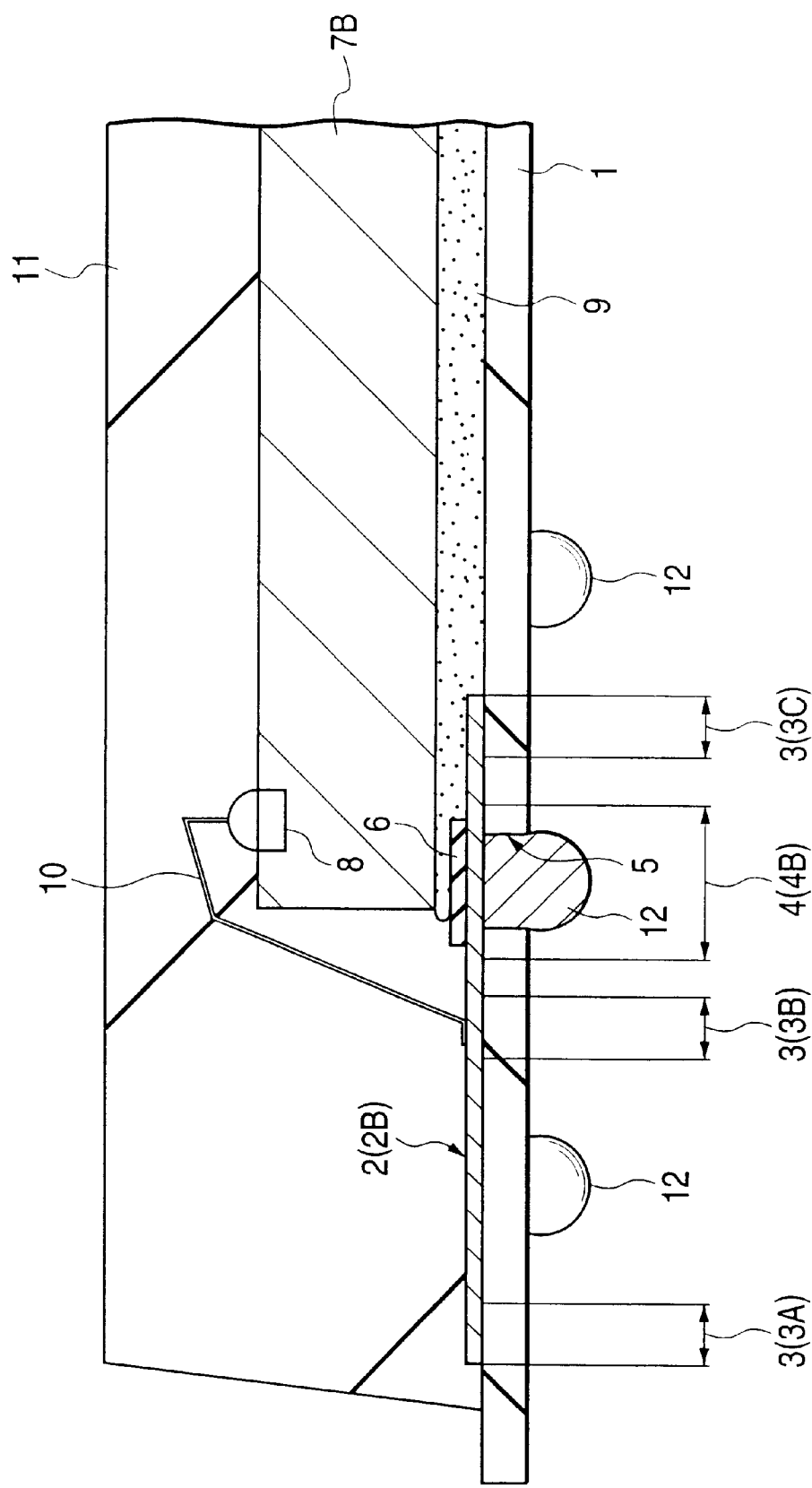
FIG. 16 is a second fragmentary cross-sectional view illustrating the integrated state of the first semiconductor chip having a smaller external size than an ordinary semiconductor chip.
Figure 17:
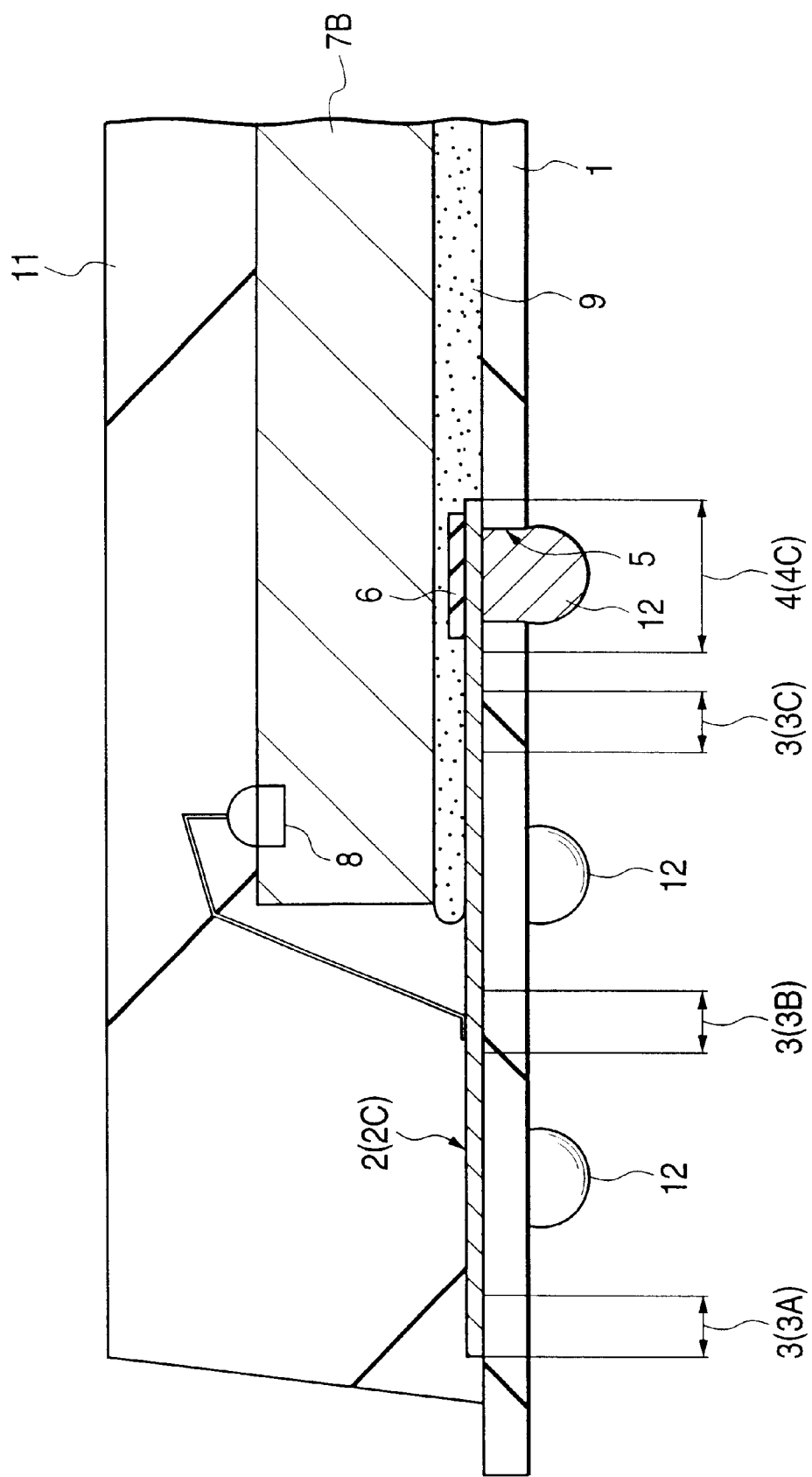
FIG. 17 is a third fragmentary cross-sectional view illustrating the integrated state of the first semiconductor chip having a smaller external size than an ordinary semiconductor chip.
Figure 18:
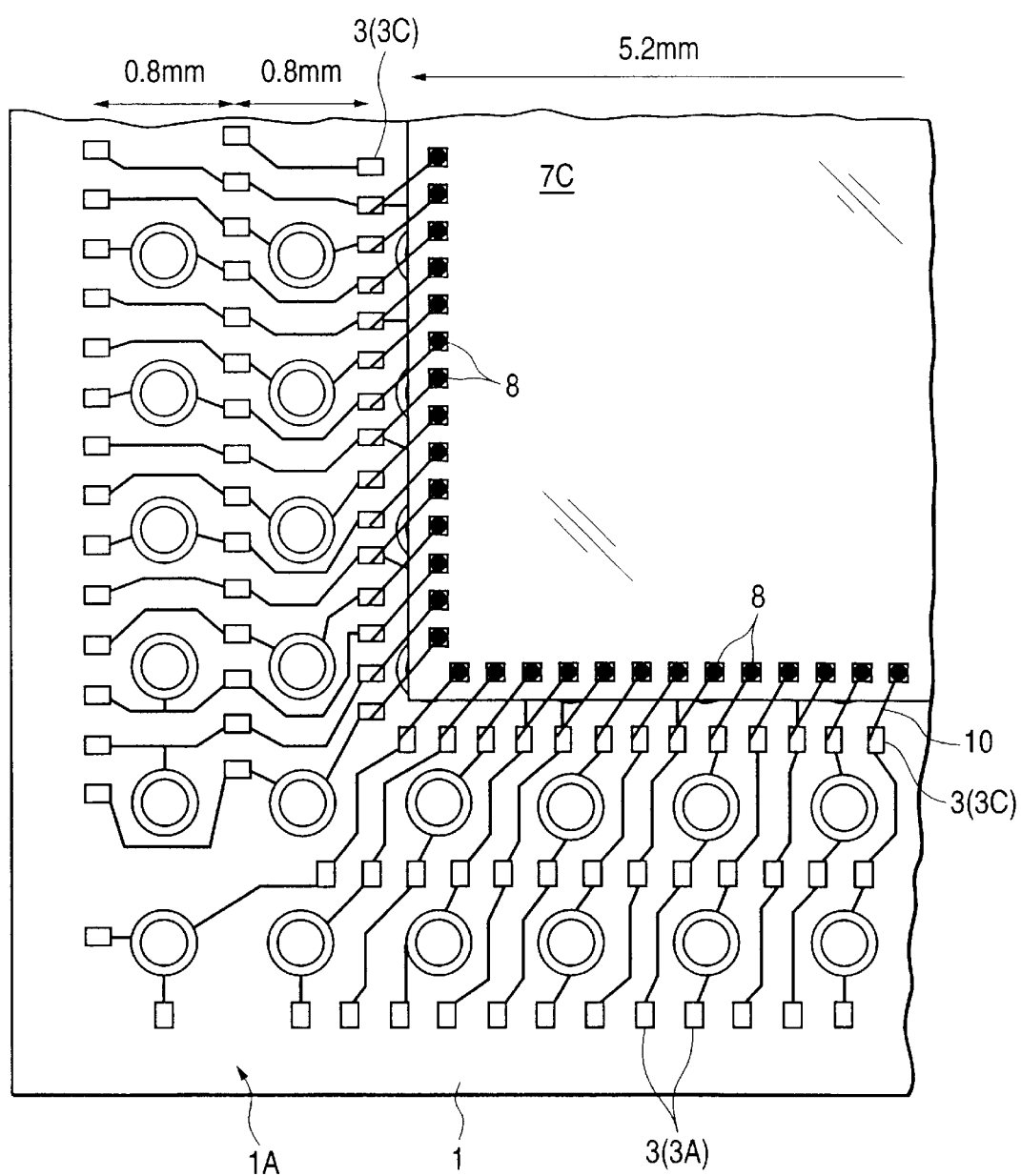
FIG. 18 is a fragmentary plan view illustrating the integrated state of a second semiconductor chip having a smaller external size than an ordinary semiconductor chip.
Figure 19:
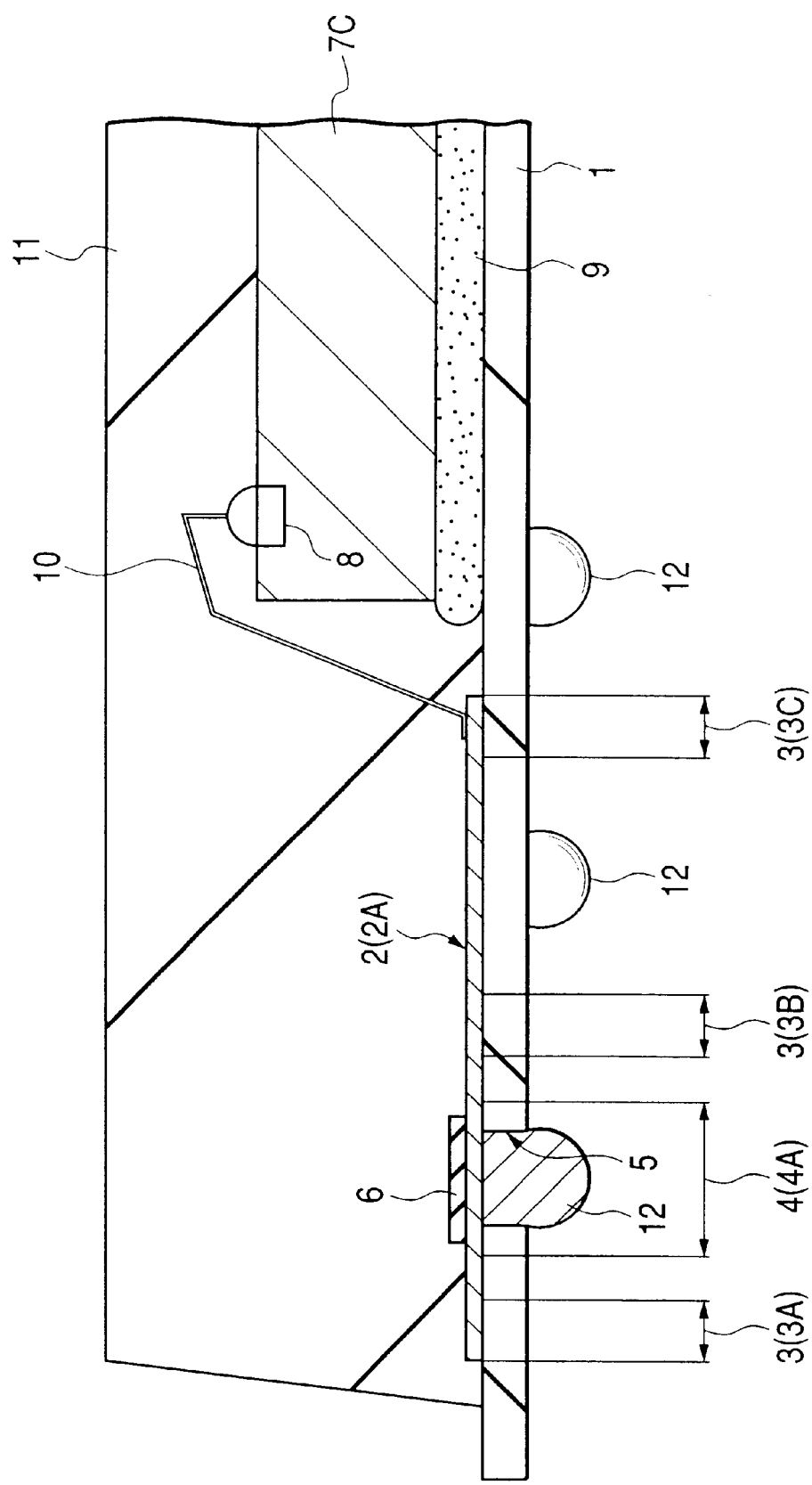
FIG. 19 is a first fragmentary cross-sectional view illustrating the integrated state of a second semiconductor chip having a smaller external size than an ordinary semiconductor chip.
Figure 20:
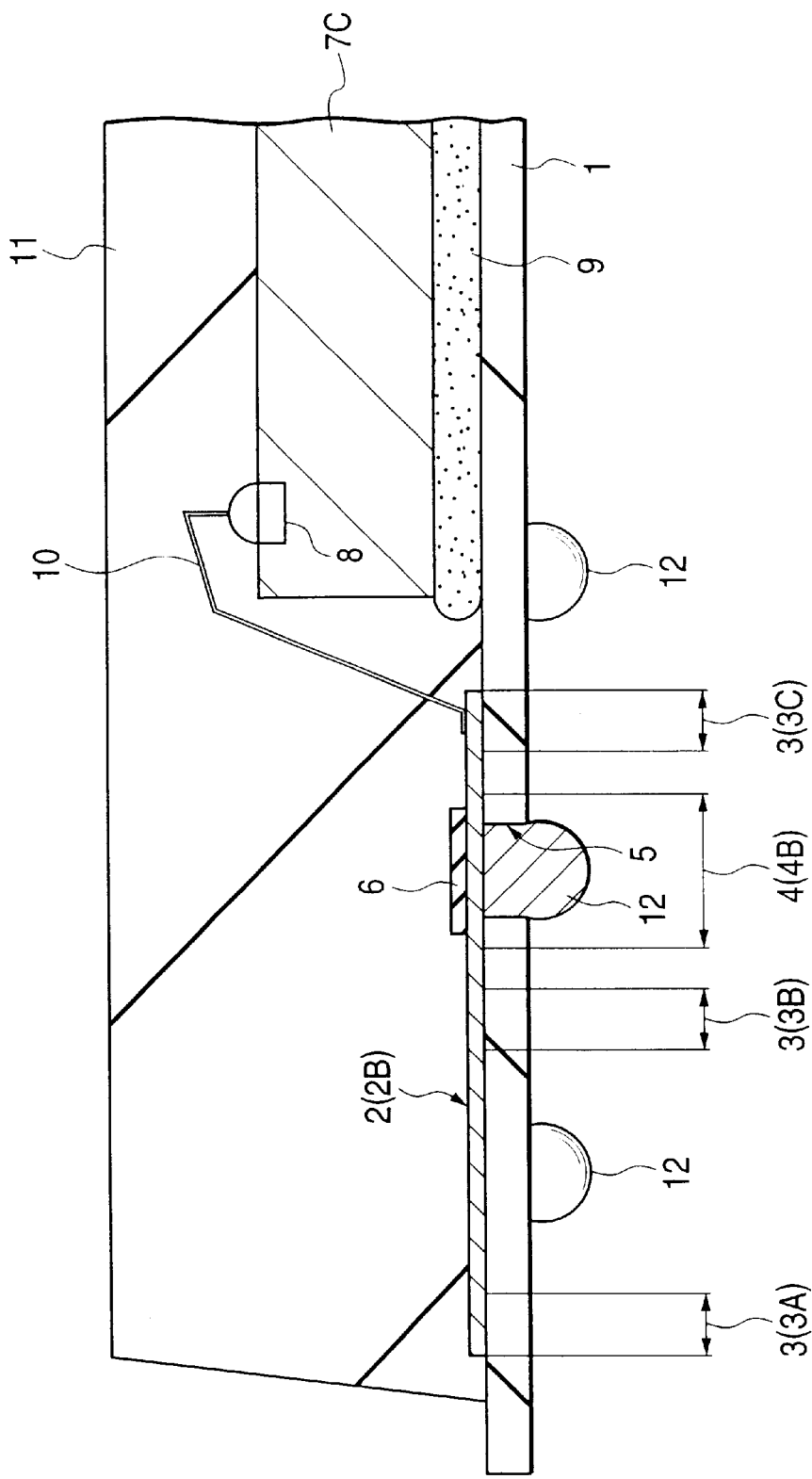
FIG. 20 is a second fragmentary cross-sectional view illustrating the integrated state of the second semiconductor chip having a smaller external size than an ordinary semiconductor chip.
Figure 21:
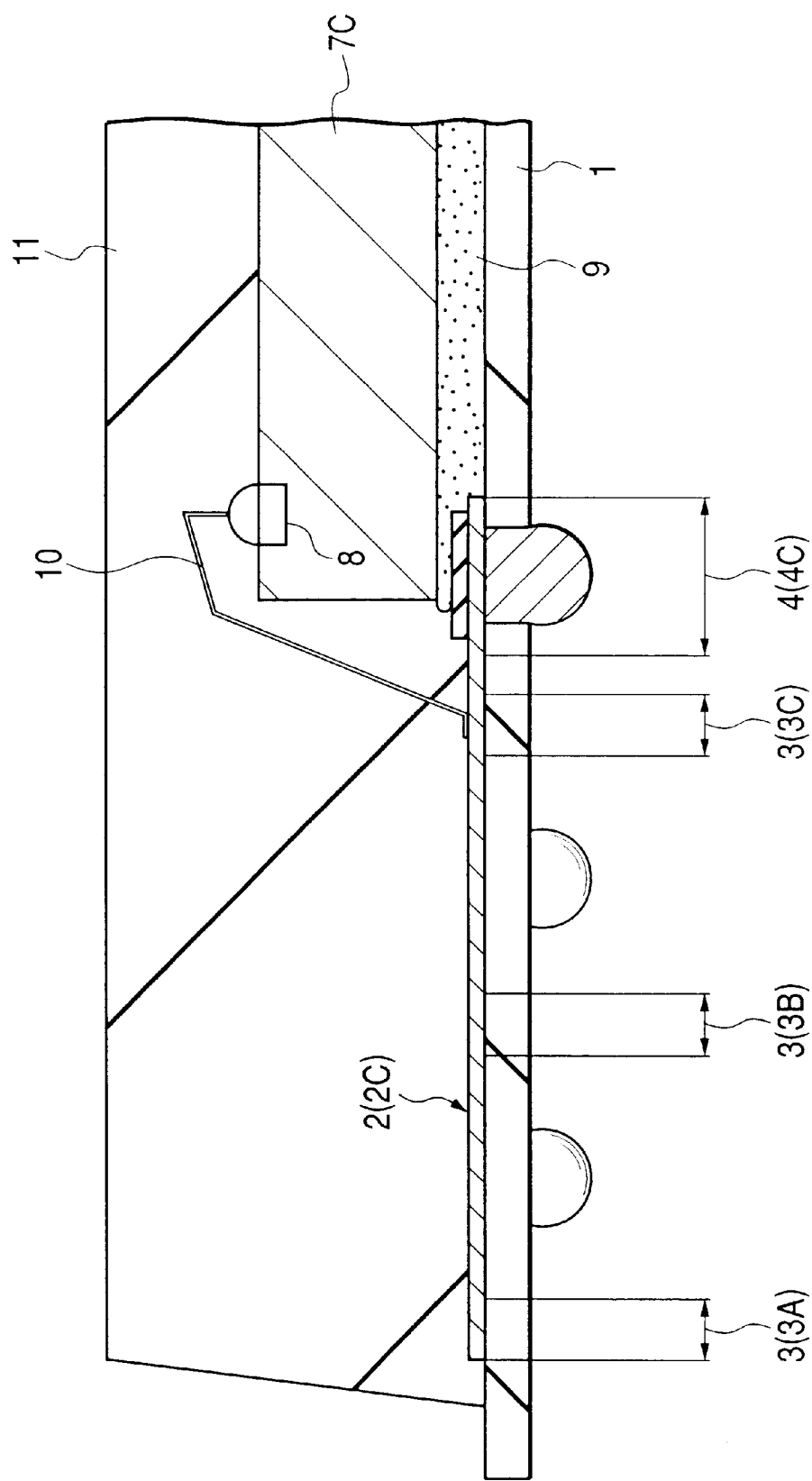
FIG. 21 is a third fragmentary cross-sectional view illustrating the integrated state of the second semiconductor chip having a smaller external size than an ordinary semiconductor chip.

FIG. 14 is a fragmentary plan view illustrating the integrated state of a first semiconductor chip smaller in external size than the semiconductor chip 7A, FIG. 15 is a first cross-sectional view illustrating the integrated state of the first semiconductor chip smaller in external size than the semiconductor chip 7A, FIG. 16 is a second cross-sectional view illustrating the integrated state of the first semiconductor chip smaller in external size than the semiconductor chip 7A, FIG. 17 is a third cross-sectional view illustrating the integrated state of the first semiconductor chip smaller in external size than the semiconductor chip 7A, FIG. 18 is a fragmentary plan view illustrating the integrated state of a second semiconductor chip smaller in external size than the semiconductor chip 7A, FIG. 19 is a first fragmentary cross-sectional view illustrating the integrated state of a second semiconductor chip smaller in external size than the semiconductor chip 7A, FIG. 20 is a second fragmentary cross-sectional view illustrating the integrated state of the second semiconductor chip smaller in external size than the semiconductor chip 7A, and FIG. 21 is a third fragmentary cross-sectional view illustrating the integrated state of the second semiconductor chip smaller in external size than the semiconductor chip 7A.

As illustrated in FIG. 14, the semiconductor chip 7B has a regular square planar shape, for example, of 6.6 [mm]×6.6 [mm]. When the semiconductor chip 7B of such an external size is integrated, since the interconnection 2 of the substrate 1 has a plurality of wire connecting pads 3 arranged from the peripheral size toward the inner side of the substrate 1, suitable one can be selected from the wire connecting pads 3 so as to shorten the length of the wire 10 in accordance with the external size of the semiconductor chip 7B. In the case of the semiconductor chip 7B, shortening of the length of the wire 10 can be attained by selecting the wire connecting pad 3B located at the second position inward from the peripheral side of the substrate 1 and connecting this wire connecting pad 3B with the electrode 8 of the semiconductor chip 7B by the wire 10.

As illustrated in FIG. 18, the semiconductor chip 7C has a regular square planar shape, for example, of 5.2 [mm]×5.2 [mm]. When the semiconductor chip 7C of such an external size is integrated, since the interconnection 2 of the substrate 1 has a plurality of wire connecting pads 3 arranged from the peripheral side toward the inner side of the substrate 1, suitable one can be selected from the wire connecting pads 3 so as to shorten the length of the wire 10 in accordance with the external size of the semiconductor chip 7C. In the case of the semiconductor chip 7C, shortening of the length of the wire 10 can be attained by selecting the wire connecting pad 3B located at the third position inward from the peripheral side of the substrate 1 and connecting this wire connecting pad 3C with the electrode 8 of the semiconductor chip 7C by the wire 10.

The length of the wire 10 is desirably about 0.5 [mm] to 1.5 [mm] at the maximum, because its length as short as possible is preferred in consideration of the inductance. In this Embodiment, the distance between pad rows is set at 0.8 [mm] so that the relationship satisfying the following equation: [wire length<distance between wire connecting pads (0.8 [mm])] is suited particularly for signal wires.

The width of the interconnection 2 is desirably about 50 to 60 [μm], because the narrower is better in consideration that the interconnection is led about on the substrate but the wider is better in consideration of the interconnection resistance. The width within the above range is therefore appropriate in consideration of the leading-about and resistance of the interconnection.

The width of the bump connecting land 4 is desirably about 0.6 [mm] when the limitation of the bump electrode 12 as an underlying electrode and a margin to be connected with the connecting hole 5 are taken into consideration.

The width of the wire connecting pad 3 is desirably about 100 to 150 [μm], because at present, the width of 80 to 90 [μm] at the minimum is indispensable to carry out bonding when the pad recognition upon wire bonding, the width of the wire connecting portion (about 60 [μm]) and the like are taken into consideration.

Thus, the below-described advantages are available by this Embodiment.

(1) Since the interconnection 2 of the substrate 1 has a plurality of wire connecting pads 3 arranged from the peripheral side to the inner side of the substrate 1, when the semiconductor chip (7B, 7C) having a smaller external size than the ordinary semiconductor chip 7A having a predetermined external size is integrated, it is possible to select a proper one from the wire connecting pads 3 so as to shorten the length of the wire 10 in accordance with the external size of the semiconductor chip (7B, 7C). This makes it possible to suppress the length of the wire 10 which otherwise increases with a decrease in the external size of the semiconductor chip and also suppresses an increase in the wire sagging. As a result, in the wire bonding step for connecting the electrode 8 of the semiconductor chip (7B, 7C) with the wire connecting pad 3 of the interconnection 2 via the wire 10, a short-circuit between the wire 10 and the interconnection 2 can be suppressed, which makes it possible to produce a semiconductor device without lowering a production yield, even when the semiconductor chip smaller in external size than the ordinary semiconductor chip is integrated.

In the step for sealing the semiconductor chip (7B, 7C) and the wire 10 with the resin sealing body 11, the wire flow caused by the insulating resin injected upon pressure can be suppressed and therefore, the occurrence of a short-circuit between two adjacent wires 10 can be suppressed, which makes it possible to produce a semiconductor device without lowering a production yield even in the case where a semiconductor chip smaller in external size than the ordinary semiconductor chip is integrated.

In addition, an increase in the inductance due to an increase in the length of the wire 10 can be suppressed, which makes it possible to produce a semiconductor device without deteriorating its electrical properties even in the case where a semiconductor chip smaller in external size than the ordinary semiconductor chip is integrated.

Moreover, an increase in the wire using amount due to an increase in the length of the wire 10 can be suppressed, which makes it possible to produce a semiconductor device without lowering its productivity even in the case where a semiconductor chip smaller in external size than the ordinary semiconductor chip is integrated.

(2) The interconnection 2 of the substrate 1 has a bump connecting pad 4 to be connected with a bump electrode 12 from the side of the second surface 1B of the substrate 1 and a plurality of wire connecting pads arranged from the peripheral side toward the inner side of the substrate 1, whereby the above-described advantages can be brought about even in the CSP type semiconductor device having a face up structure.

(3) The interconnection 2 of the substrate 1 has a bump connecting pad 4 to be connected with a bump electrode 12 from the side of the second surface 1B of the substrate 1, a plurality of wire connecting pads 3 arranged from the peripheral side toward the inner side of the substrate 1 and a branch line 2A1 branched from the main line, the branch line 2A1 having installed thereto a bump electrode 12 or another wire connecting pad 3, a plurality of wire connecting pads 3 which are electrically connected with each other can be formed easily.

(4) Since at least one of the plurality of wire connecting pads 3 electrically connected with each other is disposed between the land rows, the space between the land rows is utilized for the formation of the plurality of wire connecting pads 3, which makes it possible to form the plurality of wire connecting pads 3 without increasing an external size of the substrate 1.

(5) The formation of the substrate 1 from a plastic film makes it possible to reduce the thickness of the substrate 1 compared with that of the glass epoxy substrate having glass fibers impregnated with an epoxy resin, leading to the formation of a thin semiconductor device suitable for mounting on small-sized portable equipment.

In this Embodiment, a description was made of an example wherein the width of the wire connecting pad 3 of the interconnection 2 is formed wider than the width of the connecting portion (interconnection portion) of the interconnection 2. If there is a margin for leading-about of the interconnection on the substrate (interconnection substrate) 1, the interconnection portion for connecting the wire connecting pads 3 may be formed at the same width with that of the wire connecting pad 3.

(Embodiment 2)

Figure 22:
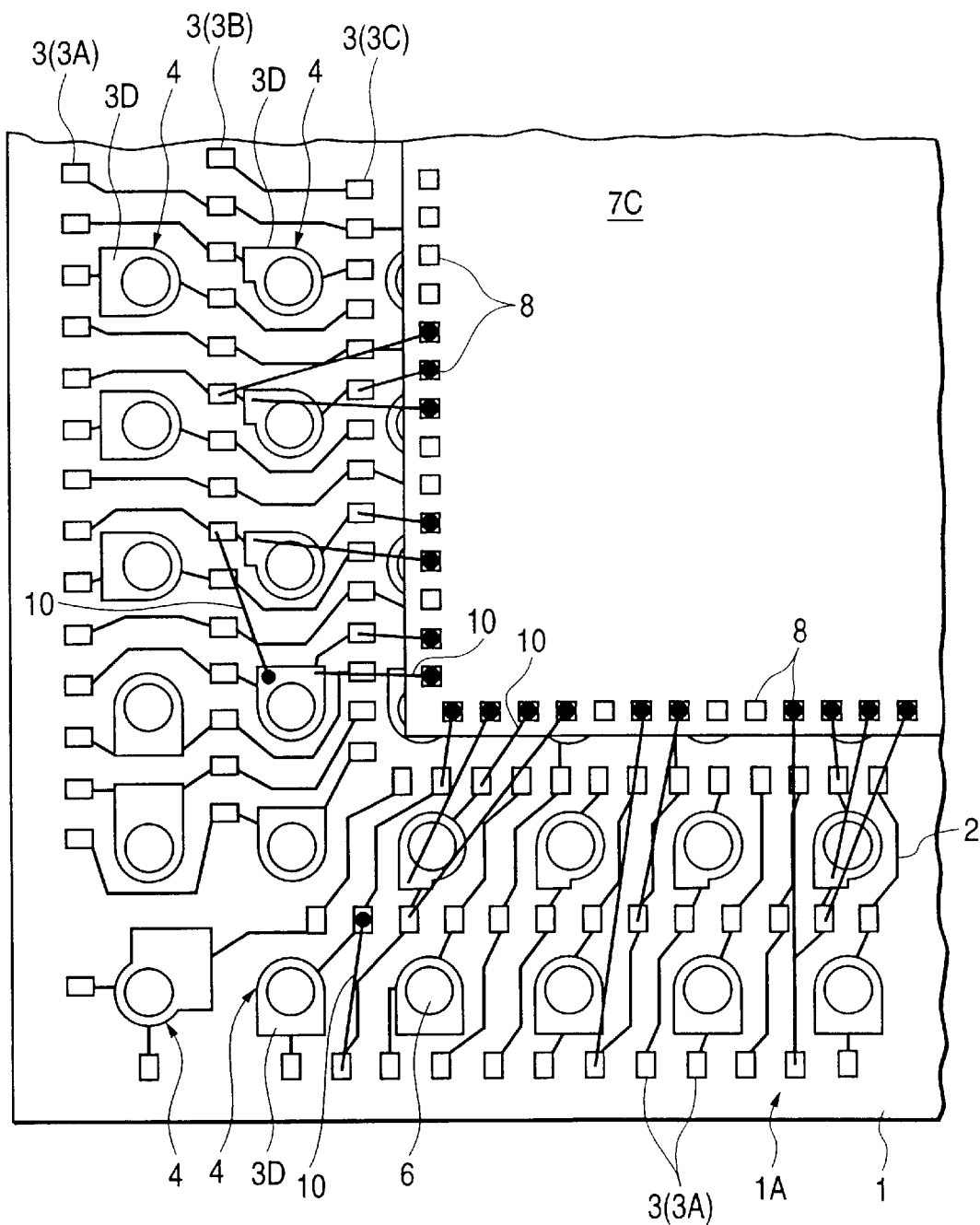
FIG. 22 is a fragmentary plan view illustrating the semiconductor device according to Embodiment 2 of the present invention from which a resin sealing body has been removed.

FIG. 22 is a fragmentary plan view illustrating a resin-sealing-body-free semiconductor device according to Embodiment 2.

As illustrated in FIG. 22, the interconnection 2 has a bump connecting land 4 to be connected with a bump electrode from the side of the second surface of the substrate 1, a plurality of wire connecting pads 3 arranged from the peripheral side toward the inner side of the substrate 1 and another wire connecting pad 3D integrated with the bump connecting land 4. The width (the width at the widest portion) of the bump connecting land 4 integrated with the wire connecting pad 3D is, for example, the total width of the bump connecting land 4 and the wire connecting pad 3 (about 0.7 to 0.75 [mm]).

A plurality of electrodes 8 of a semiconductor chip 7C comprise a source electrode (bonding pad fixed, for example, at a potential of [5V]) 8, a ground electrode (bonding pad fixed, for example, at a potential of 0 [V]) 8, a circuit function selecting electrode (bonding pad for determining whether to use or not a circuit function (for example, ROM: Read Only Memory) built in the chip by connecting with a fixed potential (source or ground potential)) 8, a signal electrode (bonding pad used for input, output or input and output of electric signals) 8 and the like.

A plurality of interconnections 2 on the substrate 1 comprise a source interconnection (bonding pad fixed, for example, at a potential of [5V]) 2, a ground interconnection (bonding pad fixed, for example, at a potential of 0 [V]) 2, a signal interconnection (bonding pad used for input, output or input and output of electric signals) 2 and the like.

One source interconnection 2 is electrically connected with a plurality of source electrodes 8 via a plurality of wires 10. One ground interconnection 2 is electrically connected with a plurality of ground electrodes 8 via a plurality of wires 10. One source interconnection 2 is electrically connected with the source electrode 8 and the circuit function selecting electrode 8, each via the wire 10. One ground interconnection 2 is electrically connected with the ground electrode 8 and the circuit function selecting electrode 8, each via the wire 10. In short, one interconnection 2 is electrically connected with a plurality of electrodes 8 fixed at the same potential, each via the wire 10.

The source interconnection 2 is electrically connected with another source interconnection 2 through the wire 10, while the ground interconnection 2 is electrically connected with another ground interconnection 2 through the wire 10.

Thus, the interconnection 2 has the bump connecting land 4 to be connected with the bump electrode from the side of the second surface of the substrate 1, a plurality of wire connecting pads arranged from the peripheral side toward the inner side of the substrate 1 and another wire connecting pad 3D integrated with the bump connecting land 4. Such a structure makes it possible to secure a region for the formation of a plurality of wire connecting pads electrically connected with each other.

By electrically connecting the interconnection 2 with another interconnection 2 via the conductive wire 10 by making use of the wire connecting pad 3 located outside of the semiconductor chip 7C, the pin function of the semiconductor device can be changed easily without a drastic design change.

By electrically connecting, via the conductive wire 10, each of the interconnections 2 with the plurality of electrodes 8 to be fixed at the same potential of the semiconductor chip 7C, the pin function of the semiconductor device can be changed easily without a drastic design change.

By electrically connecting the plurality of electrodes 8 with the same source interconnection 2, the number of signal bump electrodes (signal pins) can be increased by the number of the interconnections 2 (the number of source bump electrodes) reduced owing to the common connection, which makes it possible to multiply the function of the semiconductor device. In addition, the flexibility of the substrate 1 can be improved (a substrate for exclusive use becomes unnecessary).

Among the wire connecting pads 3D, the wire connecting pad 3D integrated with the bump connecting land 4 which is located at the outermost periphery is principally disposed between the bump connecting land 4 and the side of the substrate 1, because unless the wire connecting pad 3D integrated with the bump connecting land 4 is disposed outward, it becomes impossible to connect the plurality of electrodes 8 with the same interconnection 2 in the case where the largest chip is mounted.

(Embodiment 3)

Figure 23:
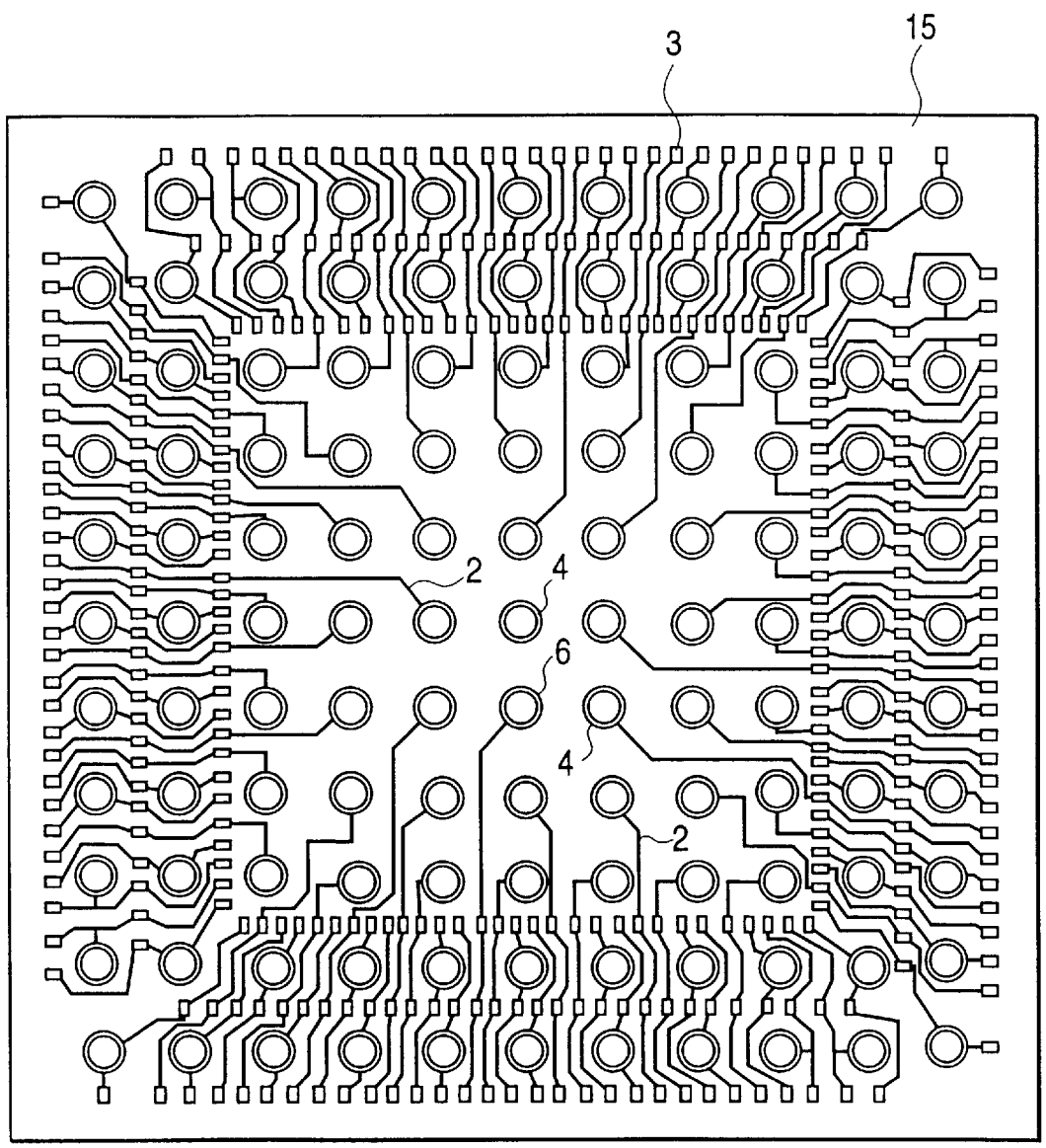
FIG. 23 is a plan view illustrating the substrate of the semiconductor device according to Embodiment 3 of the present invention.

FIG. 23 is a plan view illustrating the substrate of a semiconductor device according to Embodiment 3 of the present invention.

As illustrated in FIG. 23, the semiconductor of this Embodiment has principally the same structure with that of Embodiment 1, but differs in the following points.

In the semiconductor device according to this Embodiment, a plurality of bump connecting lands 4 are spread like an array over the substrate 15. Advantages available by the semiconductor device having such a structure are similar to those available by the above-described Embodiments.

(Embodiment 4)

Figure 24:
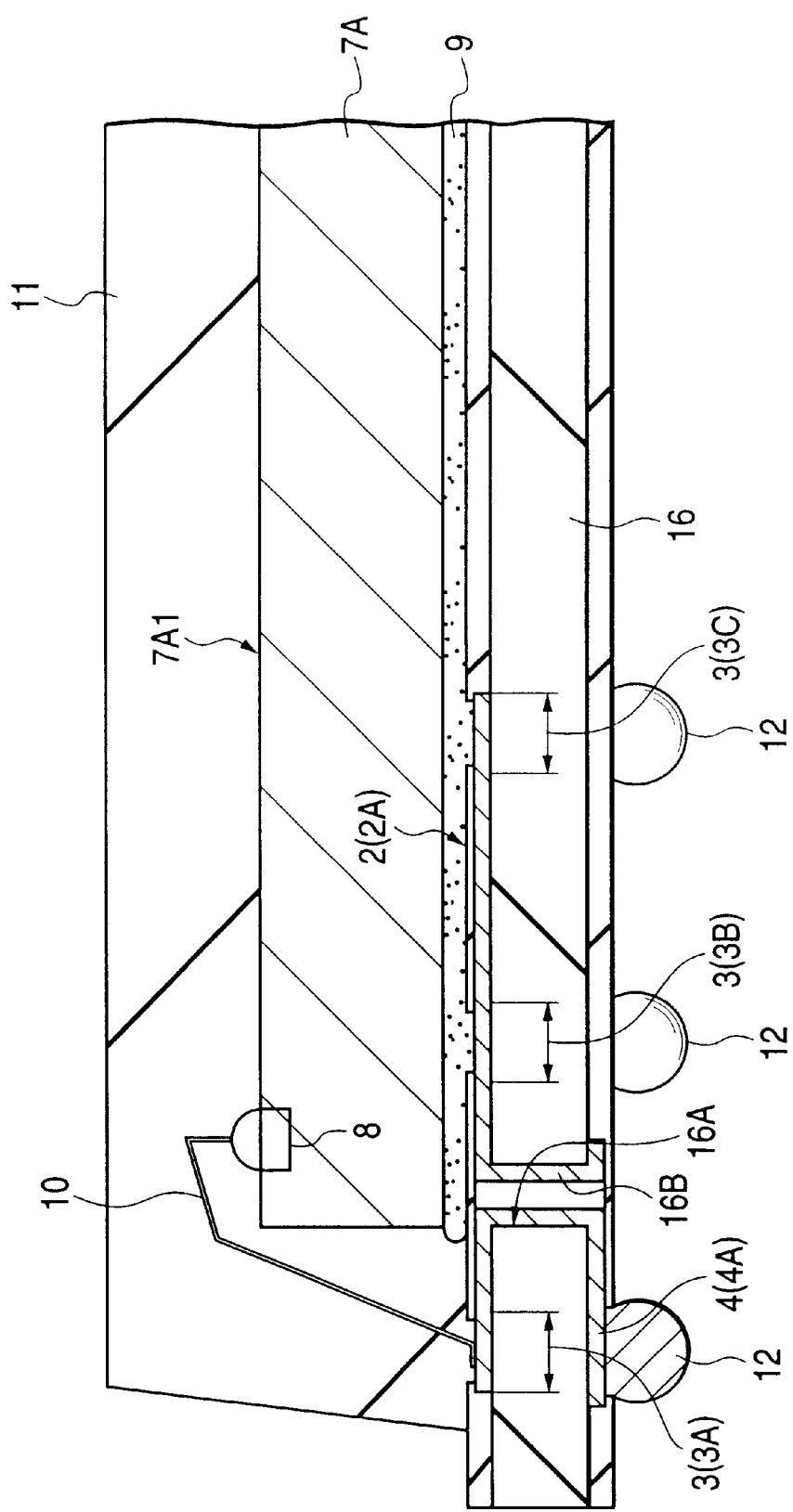
FIG. 24 is a fragmentary cross-sectional view illustrating the semiconductor device according to Embodiment 4 of the present invention.

FIG. 24 is a fragmentary cross-sectional view of a semiconductor device according to Embodiment 4 of the present invention.

As illustrated in FIG. 24, the semiconductor device according to this Embodiment has basically a similar structure to that of the above-described Embodiment 1, but differs in the following points.

The semiconductor device according to this Embodiment has a substrate 16 having an interconnection 2 formed on its chip mounting surface (one main surface) and a bump connecting land 4 formed on the second surface (another main surface) opposite to the chip mounting surface. The substrate 16 is a glass epoxy substrate obtained by impregnating glass fibers with an epoxy resin. The interconnection 2 has wire connecting pads 3A, 3B, 3C successively arranged from the peripheral side toward the inner side of the substrate 16.

The interconnection 2 and bump connecting land 4 are electrically connected through a conductor layer 16B formed in a connecting hole (through hole) 16A which extends from the chip mounting surface of the semiconductor chip 16 to the second surface. With the bump connecting land 4, a bump electrode 12 is electrically and mechanically connected, similar to Embodiment 1. The substrate 16 therefore has a multilayer interconnection structure.

The multilayer interconnection substrate using a glass epoxy material which has already been used practically for a multilayer is formed of the same materials with those of a printed circuit board (PCB). Owing to the same coefficient of thermal expansion, it is highly reliable against the temperature cycle after packaging and is therefore suited for appliances, such as personal computer, which attach great importance to their performances. In addition, the bump connecting land is disposed on the second surface side of the interconnection substrate through the connecting hole, which makes it possible to increase, by the area of the bump connecting land, the space for leading-about the interconnection on the chip mounting surface of the interconnection substrate.

For example, it is necessary to set the diameter of the bump connecting land 4 in consideration of the limitation in the size of the bump electrode 12 as an underlying electrode and, in the case of a tape substrate, a margin to be connected with the underlying connecting hole. In this Embodiment, the diameter of the bump connecting land must be set at as large as 0.6 mm, twice as much as the connecting hole size (0.3 mm) of the multilayer interconnection substrate, which is one of the causes for inhibiting the leading-about of the interconnection.

Advantages similar to those of the above-described Embodiments can be obtained even by the semiconductor device having such a structure.

The invention provided by the present inventors were so far described specifically based on the above-described Embodiments. It should however be borne in mind that the present invention is not limited by these Embodiments. It is needless to say that various changes or modifications can be made within an extent not departing from the gist of the present invention.

The advantages available by the representative inventions disclosed by the present application will next be described simply.

A semiconductor device having, integrated therein, a semiconductor chip smaller in external size than the ordinary semiconductor chip can be prepared without lowering its production yield.

A semiconductor device having, integrated therein, a semiconductor chip smaller in external size than the ordinary semiconductor chip can be prepared without deteriorating its electrical properties.

What is claimed is:

1. A semiconductor device comprising:
    a rectangular interconnection substrate having a first main surface and a second main surface which are opposite to each other;
    a plurality of pad rows which are disposed in parallel with each other over the first main surface of said interconnection substrate and are each formed of a plurality of wire connecting pads along the periphery of said first main surface, a plurality of interconnections which are formed on said interconnection substrate and extend in parallel with each other in a direction crossing each row of said plurality of pad rows and are each electrically and commonly connected with one pad row of said plurality of pad rows, a plurality of external terminals disposed on the second main surface of said interconnection substrate and electrically connected with said plurality of interconnections, respectively, a semiconductor chip being disposed over said first main surface of said interconnection substrate, being formed of a rectangular semiconductor substrate and having, on the main surface thereof, a plurality of bonding pads, and a plurality of bonding wires electrically connecting each of said plurality of bonding pads of said semiconductor chip with one of the wire connecting pads commonly connected with each of said plurality of interconnections, for electrically connecting a plurality of bonding pads of said semiconductor chip with each of said plurality of interconnections;

wherein said plurality of interconnections are formed over the first main surface on which said plurality of wire connecting pads are formed;

wherein a land row formed of a plurality of lands is disposed between two adjacent pad rows of said plurality of pad rows so as to electrically connect said plurality of external terminals with said plurality of interconnections respectively on said first main surface of said interconnection substrate; and wherein another land row formed of plural lands is disposed in a region close to a central portion of said first main surface inside of the most inner row of said plurality of pad rows so as to electrically connect, on said first main surface of said interconnection substrate, each of said plurality of external terminals with each of said plurality of interconnections.

2. A semiconductor device according to claim 1, wherein each of said plurality of lands is electrically connected with said external terminal via a conductor formed in a through hole which extends from the first main surface to the second main surface of said interconnection substrate.

3. A semiconductor device according to claim 2, wherein said rectangular semiconductor chip is disposed on said first main surface of said interconnection substrate so as to expose the most peripheral pad row of said plurality of pad rows but to cover the other pad row adjacent thereto; and said plurality of bonding pads of said semiconductor chip are electrically connected with said plurality of pads of the most peripheral pad row via said plurality of binding wires.

* * * * *